United States Patent [19]

Scott et al.

[11] Patent Number: 5,212,659
[45] Date of Patent: May 18, 1993

[54] LOW PRECISION FINITE IMPULSE RESPONSE FILTER FOR DIGITAL INTERPOLATION

[75] Inventors: Jeffrey W. Scott; Donald A. Kerth; Shaochyi Lin, all of Austin, Tex.

[73] Assignee: Crystal Semiconductor, Austin, Tex.

[21] Appl. No.: 773,044

[22] Filed: Oct. 8, 1991

[51] Int. Cl.$^5$ .............................................. G06F 15/31
[52] U.S. Cl. ............................................... 364/724.1
[58] Field of Search ............ 364/724.1, 724.01, 724.16

[56] References Cited

U.S. PATENT DOCUMENTS

| | | | |
|---|---|---|---|
| 3,997,772 | 12/1976 | Crochiere et al. | 364/724.1 |
| 3,997,773 | 12/1976 | Van Essen et al. | 364/724.1 X |
| 4,472,785 | 9/1984 | Kasuga | 364/724.1 X |
| 4,748,578 | 5/1988 | Lagadee et al. | 364/724.1 |

OTHER PUBLICATIONS

R. E. Crochiere and L. R. Rabiner, "Interpolation and Decimation of Digital Signals: A Tutorial Review", Proc. IEEE, vol. 69, pp. 300-331, Mar. 1981.
A. B. Oppenheim and R. W. Schafer, "Discrete-Time Signal Processing", Englewood Cliffs, N.J.: Prentice Hall, 1989, pp. 105-111.
D. S. K. Chan and L. R. Rabiner, "Analysis of Quantization Errors in the Direct Form for Finite Impulse Response Digital Filters", *IEEE Transactions on Audio and Electroacoustics*, vol. AU-21, pp. 354-366, Aug. 1973.
E. B. Hogenauer, "An Economical Class of Digital Filters for Decimation and Interpolation", *IEEE Trans. Acoust. Speech, Signal Processing*, vol. ASSP-29, pp. 155-162 Apr. 1981.
T. W. Wong and R. M. Gray, "FIR Filters with Sigma-Delta Modulation Encoding", *IEEE Trans. on Acous., Speech and Signal Processing*, vol. 38, pp. 979-990, Jun. 1990.

Primary Examiner—Tan V. Mai
Attorney, Agent, or Firm—Gregory M. Howison

[57] ABSTRACT

A low precision Finite Impulse Response filter (FIR) is provided for filtering in a digital interpolation operation. The interpolation operation includes two steps, a sampling rate conversion operation for interspersing zeroes between samples in an input sequence and a filtering step of filtering out images that result from this operation. The filtering operation utilizes a FIR filter that utilizes low precision filter coefficients that are selected to tune the frequency response such that the low end frequency response including the pass band, the transition band, and the portion of the stop band immediately after the transition band provides a response equivalent to that commensurate with substantially higher precision FIR filter coefficients, with the high frequency end of the stop band gradually increasing. A second, low pass filter section is provided for filtering out the image energy that exists at the output of the FIR filter in the high frequency end of the stop band to provide an overall filter response that is commensurate to that utilizing substantially higher precision FIR coefficients in the filter section. The FIR filter coefficients utilized are restricted to the set of [−1, 0, +1] such that a multiplierless FIR filter can be realized. The FIR filter coefficients are obtained by processing the infinite FIR filter coefficients through a software delta-sigma quantizer which quantizes the output to the desired low precision FIR filter coefficients.

27 Claims, 9 Drawing Sheets

LOW PRECISION FINITE IMPULSE RESPONSE FILTER FOR DIGITAL INTERPOLATION

TECHNICAL FIELD OF THE INVENTION

The present invention pertains in general to digital filters and, more particularly, to a finite impulse response filter for use in a digital-to-analog converter.

BACKGROUND OF THE INVENTION

Digital-to-analog converters have recently seen an increased use of an oversampled architecture. Oversampled digital-to-analog conversion typically runs four, eight or even sixty-four times faster than the input word rate, requiring a corresponding higher number of samples to be generated for every input sample. Typically, in this type of architecture, digital or discrete-time interpolation is utilized to provide this increase in the input word rate. In digital interpolation, two distinct steps are utilized with the Fourier Transform. The first step of interpolation is to receive the input sequence $x[n]$, representing the Fourier Transform $X[f]$, at a sample rate of $f_s$. This input sequence $x[n]$ is processed to provide the output sequence $y[n]$, which is essentially the sequence $x[n]$ with $M-1$ zeroes interspersed between samples, where M is the interpolation factor.

In the frequency domain, the interspersing of zeroes simply rescales the frequency axis. However, the rescaled frequency domain now contains images of the original, low frequency signal. The images can be removed by straightforward, digital low pass filtering, which comprises the second step of the interpolation process. Therefore, the output of the digital low pass filtering step will be the sequence $z[n]$, with the Fourier Transform $Z[f]$. The sequence $z[n]$ is the $y[n]$ sequence with the zeroes "filled in". The end result is an interpolator output sequence whose samples occur at a rate that is faster than the input sample rate by a factor of M. The general process of interpolation is disclosed in R. E. Crochiere and L. R. Rabiner, "Interpolation and Decimation of Digital Signals: A Tutorial Review", *Proc. IEEE*, Vol. 69, pp. 300–331, March 1981, and A. B. Oppenheim and R. W. Schafer, "Discrete-Time Signal Processing", Englewood Cliffs, N.J.: Prentice Hall, 1989. Both of these references are incorporated herein by reference.

The first interpolation step is very conventional and generally comprises the steps of interspersing zeroes between the input samples, which is a relatively straightforward process. However, the second step of digital low pass filtering presents a problem to a hardware designer. Typically, a Finite Impulse Response (FIR) filter of length N is utilized due to the superior phase characteristics and out of band image rejection provided by this type filter. The input to the FIR filter is the $y[n]$ sequence with a second input, the coefficient input, being provided from a storage area that has the coefficients $h[0], h[1], h[2] \ldots H[N-1]$. This set of filter coefficients completely defines the frequency response of the FIR filter. The number of binary bits required to accurately represent each coefficient is dictated by filter performance parameters, the most sensitive one typically being stop-band rejection. This is disclosed in D. S. K. Chan and L. R. Rabinier, "Analysis of Quantization Errors in the Direct Form for Finite Impulse Response Digital Filters", *IEEE Transactions on Audio and Electroacoustics*, Vol. AU-21, pp. 354–366, August 1973, which is incorporated herein by reference.

In the case of interpolation, the filter stop-band rejection directly determines the extent to which the out-of-band images will be attenuated. The conventional rule of thumb is about 6 db of stop-band or image rejection for every binary bit utilized to represent filter coefficients. The conventional filter is realized with a plurality of delay blocks, each having the output multiplied by the associated filter coefficient and then summed, the output rate of the FIR filter being faster than the word rate of the $x[n]$ input sequence by a factor of M. Therefore, the filter must perform N/M multiplies and adds for every output word. Assuming the input data is represented by k binary bits and the FIR filter coefficients are represented by m binary bits, the computational requirement is that at the $z[n]$ output word rate, there are required N/M ($k \times m$) multiplies/adds or, that at the $x[n]$ input word rate, there are required N($k \times m$) multiplies/adds. For example, if a 16-bit digital audio data input were interpolated from a word rate of 48 kHz to a rate $4\times$ faster, this would result in a word rate of 192 kHz. A digital audio quality FIR filter operating at $4\times$ may have a length N=128 with 14-bit coefficients. The resulting computational burden is 128 (16-bit $\times$ 14-bit) multiplies/adds at 48 kHz. Note that the computation rate must double for a stereo implementation and, therefore, a single 16-bit $\times$ 14-bit hardware multiplier must operate at $2 \times 128 \times 48$ kHz $= 12.28$ MHz for digital audio quality $4\times$ interpolation.

Since this computation rate is close to the limit for state-of-the-art CMOS technology, and since fast parallel multipliers are too expensive in terms of silicon area to consider utilizing more than one, higher interpolation ratios (M>4) are typically realized in steps. For example, one conventional part number, Part No. SAA7322, manufactured by Philips, provides a stereo CMOS DAC for Compact Discs Digital Audio Systems that realizes a 256$\times$ interpolation factor in three separate steps: $4\times$, $32\times$ and $2\times$. The first step of $4\times$ is implemented utilizing a multiplier-based 128 tap FIR. The second step of $32\times$ is a simple linear interpolator, and the final $2\times$ step is a zero-order hold. One can safely draw the general conclusion that although the last steps in a multi-step interpolation process can be quite rudimentary, the need for a fast (parallel) digital multiplier of k-bit input data by m-bit filter coefficients has persisted in conventional, digital audio quality interpolation architectures.

In view of the above disadvantages, there exists a need for an interpolation scheme that provides a relatively high precision FIR filter to result in significant rejection in the stop-band without requiring the expensive and complex multipliers of conventional units.

SUMMARY OF THE INVENTION

The present invention disclosed and claimed herein comprises a digital interpolator The digital interpolator includes an input for receiving a digital input sequence at a first sampling rate, the sampling rate increased to a second and higher sampling rate by a sample rate converter. An interpolator filter filters out the images of the output of the sample rate converter, the interpolator filter having a frequency response with a pass band for passing through with minimum attenuation the interpolated input sequence, a stop band for attenuating images of the interpolated sequence to a predetermined level, and a transition band between the pass band and the stop band. The interpolation filter includes a Finite Impulse Response (FIR) filter having low precision FIR filter coefficients associated therewith that provide a frequency response below a point in the stop band that is commensurate with substantially higher precision FIR filter coefficients. The frequency response above this point degrades in a substantially gradual manner. A low pass filter is provided for filtering the output of the FIR filter to attenuate signals above that point.

In another aspect of the present invention, the point above which the low pass filter attenuates the signals is proximate to the transition band. The low precision FIR filter coefficients include at least the set of $\{-1, +1\}$ coefficients and further can include a zero coefficient. The FIR filter includes a plurality of delay blocks and a summing circuit, with the output of each of the delay blocks multiplied by associated ones of the low precision FIR filter coefficients. The output of the multiplication block is input to the summing circuit for summing of the results. Only a sign change is required since the FIR filter coefficients comprise the set of $\{-1, +1\}$.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
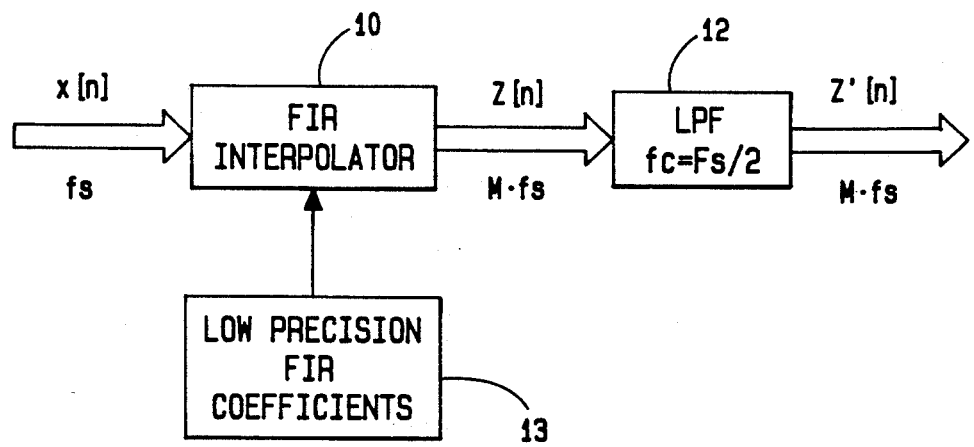
FIG. 1 illustrates a block diagram of the interpolation filter utilizing the low-precision FIR coefficients.

Referring now to FIG. 1, there is illustrated a block diagram of the interpolator of the present invention. The interpolator is generally represented by a block 10 that is labelled "FIR interpolator". The interpolator is comprised of the interpolation block that is operable to intersperse zeroes between the samples in the x[n] input sequence and the filtering step wherein the passband response is defined and the images are partially filtered out. As will be described hereinbelow, this provides the low frequency response which is required for high quality interpolators. This results in the output z[n] sequence, which is a filtered output that is interpolated by a factor M. This is input to a low pass filter block 12, which has a cutoff frequency $f_c$ that is equal to $f_s/2$. This results in an output z'[n] that operates at a sampling frequency $Mf_s$. It should be noted that the FIR interpolator 10 operates on low precision FIR coefficients stored in a block 13, which coefficients are utilized to define the frequency response of the filter portion of the FIR interpolator 10 at the low frequency. However, as will =described hereinbelow, the low precision coefficients do not result in a desirable stop band response of higher frequencies. This is achieved with low pass filter block 12.

Figure 2:
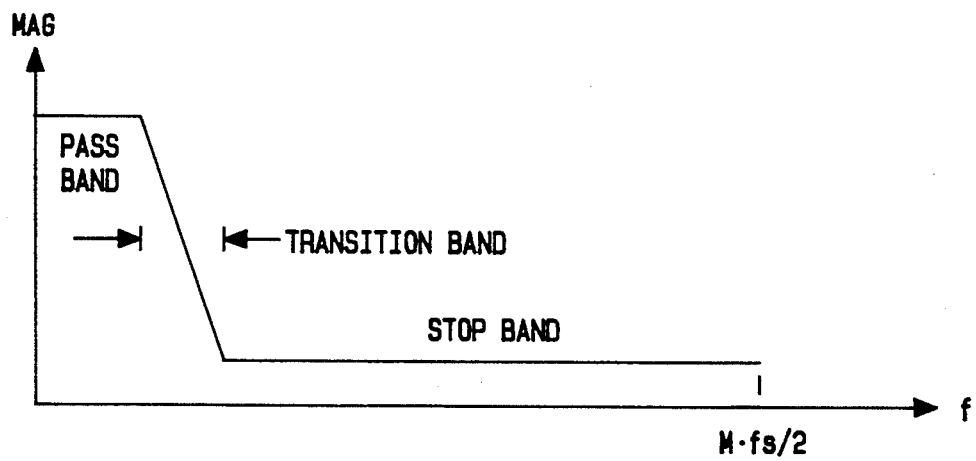
FIG. 2 illustrates the required interpolation frequency response required for the overall interpolation filters.

Referring now to FIG. 2, there is illustrated an overall frequency response for the complete interpolation process. Once the zeroes are interspersed among the samples in the input sequence x[n], it is necessary to provide this type of overall response for applications such as digital-to-analog converters. In the preferred embodiment, the interpolation operation is a single step 64× interpolation with a 1792 tap FIR filter with the FIR filter coefficients restricted to the set $\{-1, 0, +1\}$. The pass band ripple of the filter response is $\pm 0.10$ dB, with a pass band definition of $+0.20$ dB, $-0.50$ dB. The transition band is a transition between the pass band and the stop band with this existing between 0.45-0.55 $f_s$. The stop band rejection is desired to be greater than 70 dB. Therefore, a very sharp filter is required, which is the purpose for utilizing a FIR digital filter. However, as will be described hereinbelow, the use of low precision FIR coefficients resulting in a low precision FIR filter to obtain the desirable low frequency response and sufficient stop band rejection of the total frequency response of operation is an important aspect of the present invention.

Figure 3A:
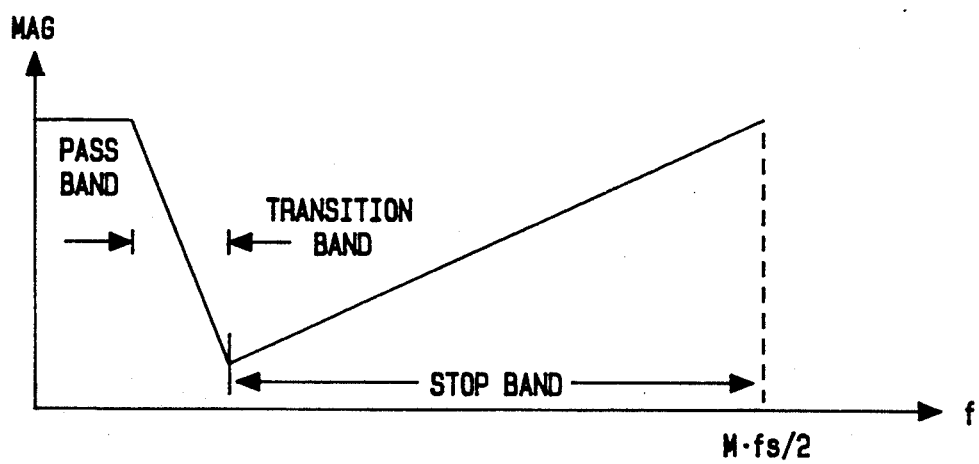
FIGS. 3a and 3b illustrate the frequency responses of the FIR filter with low-precision coefficients and the subsequent low pass filter.

Referring now to FIG. 3a, there is illustrated a frequency plot of the FIR interpolation filter utilized in the present invention. The filter is designed such that the pass band and the transition band meet the overall design requirements for a FIR filter designed with high precision FIR filter coefficients, such that proximate to the transition band, the stop band has a desirable amount of attenuation. However, it can be seen that the attenuation of the stop band above the point proximate to the transition band gradually degrades and is unacceptable. This will be described in more detail hereinbelow.

Figure 3B:
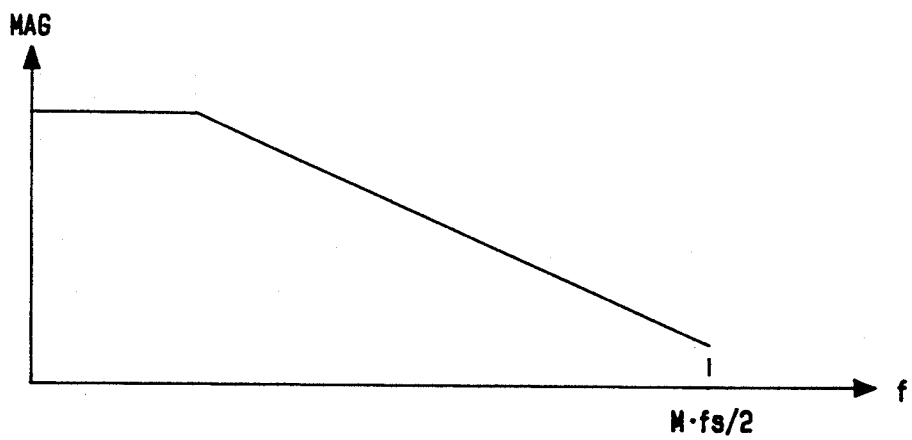

Referring now to FIG. 3b, there is illustrated a frequency response plot for a low pass filter function that is associated with the low pass filter 12 and which filters out the degradation in the stop band that is unacceptable with respect to the frequency response of FIG. 3a. The combination of the response of FIG. 3a and the response of FIG. 3b results in the desired response of FIG. 2. However, the response of FIG. 3a was obtained with very low precision FIR filter coefficients and the response of FIG. 3b was attained with the use of the relatively straightforward filter design. In the preferred embodiment, the low pass filter 12 is comprised of the output switched capacitor filter operating in the analog domain on a digital-to-analog converter. However, it should be understood that the digital filter function could be implemented in the digital domain at the higher sampling frequency.

Figure 4:
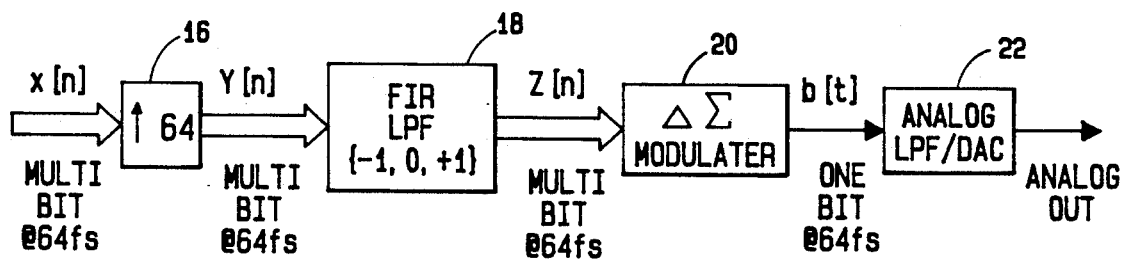
FIG. 4 illustrates a block diagram of the FIR interpolation filter of the present invention, utilizing a digital-to-analog converter.

Referring now to FIG. 4, there is illustrated a more detailed block diagram of the preferred embodiment of the present invention. The input sequence x[n] is a multi-bit input, typically sixteen bits, that is input to sample rate converter 16 that is operable to increase the sampling rate to a factor of 64× the sampling frequency of the input sequence x[n]. This results in an output sequence of y[n] that is also a multi-bit signal. The sequence y[n] is input to a FIR low pass filter 18, which has FIR filter coefficients restricted to the set {−1, 0, +1} for each stage of the filter, as described above. The FIR low pass filter 18 is operable to filter out the images resulting from the interspersing of zeroes in the sample rate converter 16. This results in the filtered sequence z[n], which is also a multi-bit sequence operating at 64× the sampling frequency. This is input to a conventional delta-sigma modulator that is operable to output a digital 1-bit output at 64× the sampling frequency, which output is then input to an analog low pass filter/1-bit digital-to-analog converter 22. This provides the analog output of the overall digital-to-analog converter.

Figure 5A:
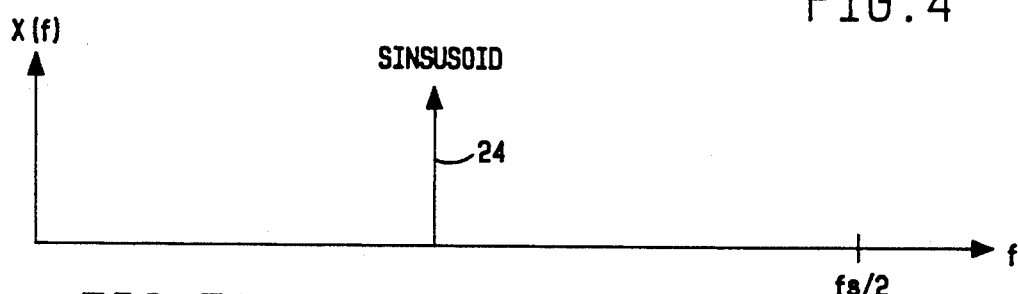
FIGS. 5a-5e illustrate the frequency response plots for the various stages of the embodiment of FIG. 4.
Figure 5B:
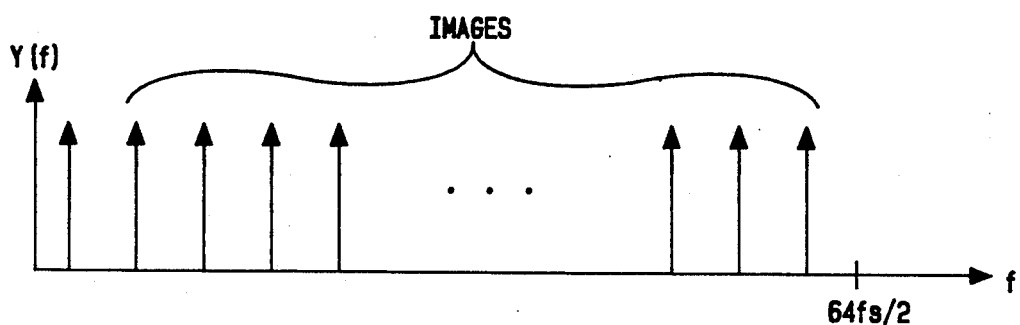
Figure 5C:
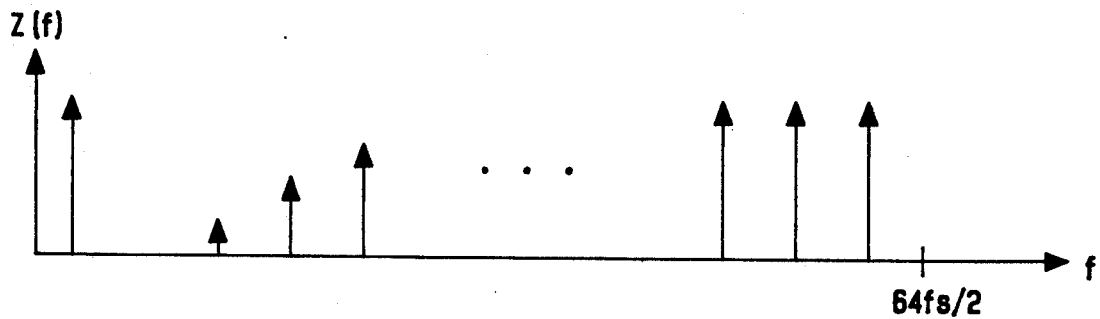
Figure 5D:
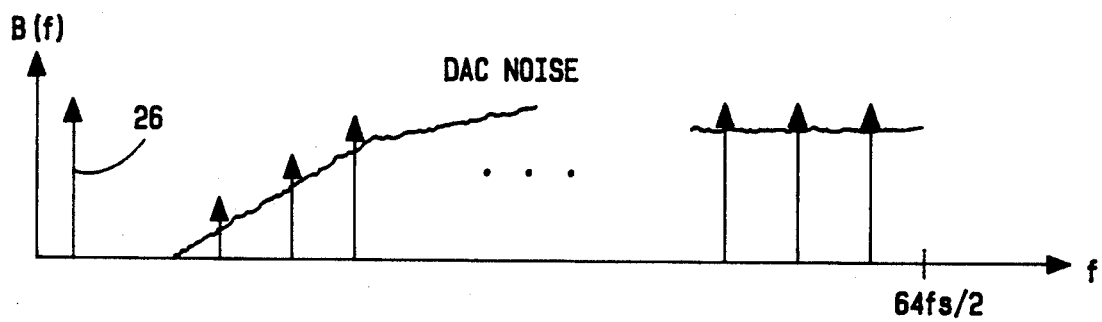
Figure 5E:
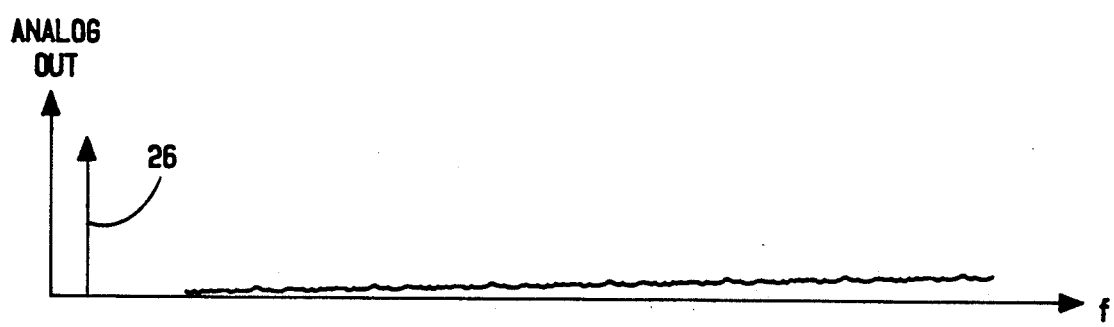

Referring now to FIGS. 5a–5e, there are illustrated frequency plots for each step of the conversion process. FIG. 5a illustrates the frequency response X[f], which is the frequency response for the input data. As expected, this is merely a sinusoid with a single frequency component 24 in the frequency spectrum. It can be seen that this is substantially less than $f_s/2$. FIG. 5b illustrates the frequency response for the sinusoid of FIG. 5a at the output of the sample rate converter 16, illustrating the images of the sinusoid that result after the interspersing of zeroes between the samples in the x[n] input sequence. FIG. 5c illustrates the output of the FIR low pass filter 18 with the low precision FIR coefficients, where it can be seen that the sinusoid is passed through the pass band, as illustrated by a frequency component 26, and the remaining images are filtered out with the images most proximate to the transition band and just outside the pass band, being heavily attenuated, and the remaining images being less heavily attenuated in a gradual manner. FIG. 5e illustrates the output of the analog low pass filter/DAC 22, wherein all of the images in the stop band are significantly attenuated. Therefore, it can be seen that the use of the low precision FIR low pass filter, that provides the desired low frequency response in the pass band and about the transition band, can be combined with the low pass filter to result in an overall frequency response that is equivalent to that of a high precision FIR low pass filter for utilizing multi-bit FIR coefficients. For example, a high precision FIR low pass filter could require in excess of fourteen bits for each coefficient, which would require relatively complex multiplier stages in the circuitry that is utilized to realize the FIR low pass filter.

Figure 6:
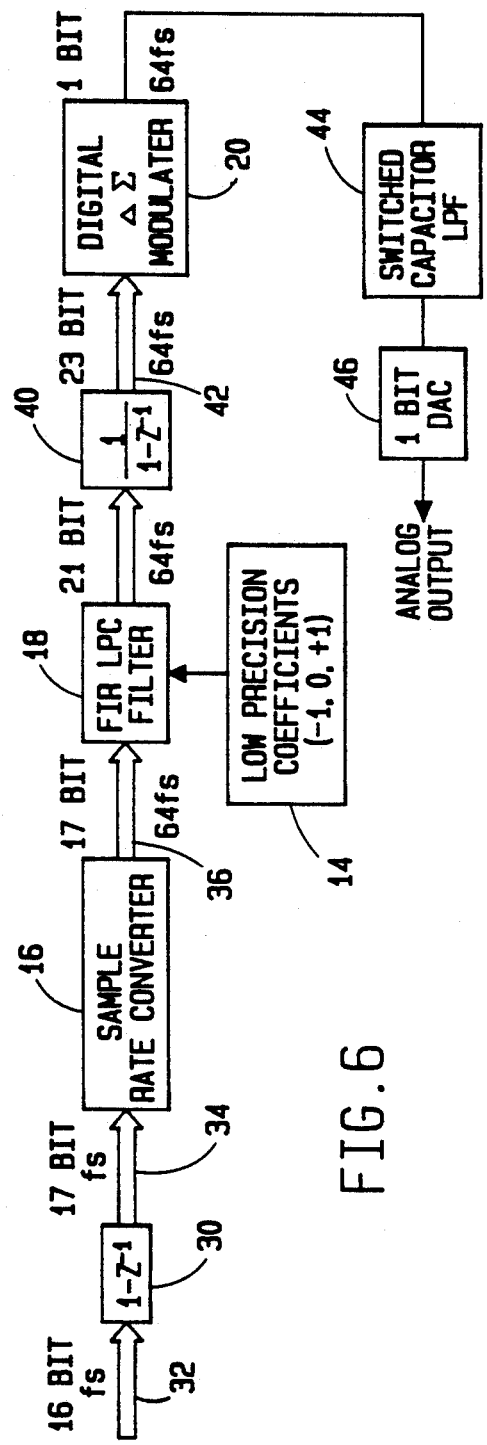
FIG. 6 illustrates the preferred embodiment of the present invention.

Referring now to FIG. 6, there is illustrated the preferred embodiment of the digital-to-analog converter utilizing the low precision FIR low pass filter. The output of the FIR low pass filter 18 results in high frequency images that approach or exceed the magnitude of the pass band sinusoid. It would therefore be anticipated that the operation of a digital delta-sigma modulator 20 would be degraded due to the image energy at the high end of the stop band being input to the digital delta-sigma modulator. To prevent this, a relatively simple image attenuating digital filter is provided after the low precision coefficient FIR low pass filter 18 to reduce these stop band images. To attenuate these high frequency images, the filter need only attenuate the gradual rise in the image energy resulting from the use of the low pass filter 18 with the low precision coefficients. The filter that is utilized in the present invention is a zero-order hold or SINC filter. This filter is described in E. B. Hogenauer, "An Economical Class of Digital Filters for Decimation and Interpolation", *IEEE Trans. Acoust. Speech, Signal Processing,* Vol. ASSP-29, pp. 155–162, April 1981, which reference is incorporated herein by reference. The zero-order hold filter provides an impulse response that is defined by the following transfer function:

$$H(z) = \frac{1}{N}\left(\frac{1-z^{-n}}{1-z^{-1}}\right) \quad (1)$$

Where N in the zero-order hold transfer function is equal to the oversampling or interpolation ratio M, this filter is relatively easy to implement. It utilizes a low speed differencing block 30 that provides the transfer function "$1-z^{-1}$", which operates at the input sampling frequency. The input sequence x[n] is a 16-bit word input on a bus 32 to the input of the block 30. The output of the block 30 is provided on a bus 34, which comprises a seventeen-bit output operating at the sampling frequency $f_s$. This is input to the sampling rate converter 16. The sampling rate converter 16 is then operable to increase the sampling rate by a factor of 64 to provide a seventeen-bit output on a bus 36. This is then input to the FIR low pass filter 18 that utilizes low precision FIR filter coefficients stored in the coefficient memory 14. This will then provide a digitally filtered output on a bus 38 that is a twenty-one-bit output operating at 64× the sampling frequency $f_s$. This is input to a high speed accumulator 40, having a transfer function equal to:

$$\frac{1}{1-z^{-1}} \quad (2)$$

The high speed accumulator 40 operates at 64× the input sampling frequency, whereas the difference block 30 operates at the lower speed sampling frequency. The combination of the accumulator 40 and the difference block 30 provide the zero-order hold filter function, which is sometimes referred to as a Comb-Integrate-Cascade filter (CIC). One disadvantage to the utilization of the zero-order hold filter having an impulse response length equal to the interpolation function ratio is that a pass band droop of approximate 4 dB results. However, this can be compensated for in the design of the FIR filter by being designed to offset this pass band droop.

The output of the accumulator 40 is a twenty-three-bit output, operating at 64× the sampling frequency $f_s$, which is output on a bus 42 to the digital delta-sigma modulator 20. The one-bit output of the modulator 20 is then input to a one-bit digital-to-analog converter 44 and then to a switched capacitor low pass filter 46. This provides the analog output. The design of the one-bit digital-to-analog converter 44 and the switched capacitor low pass filter 46 is described in U.S. patent application Ser. No. 571,376, filed Aug. 22, 1990, now U.S. Pat. No. 5,061,925 and entitled "Phase Equalization System for a DAC", which patent application is incorporated herein by reference. The Ser. No. 571,376 patent also discloses a phase equalization technique which is also utilized in the digital-to-analog converter of the present invention. In this manner, the overall phase response of the FIR filter 18 and the switched capacitor filter 24, which is an Infinite Impulse Response Filter (IIR), are designed together such that phase deficiencies in either filter can be compensated by the design of the other filter.

Figure 7:
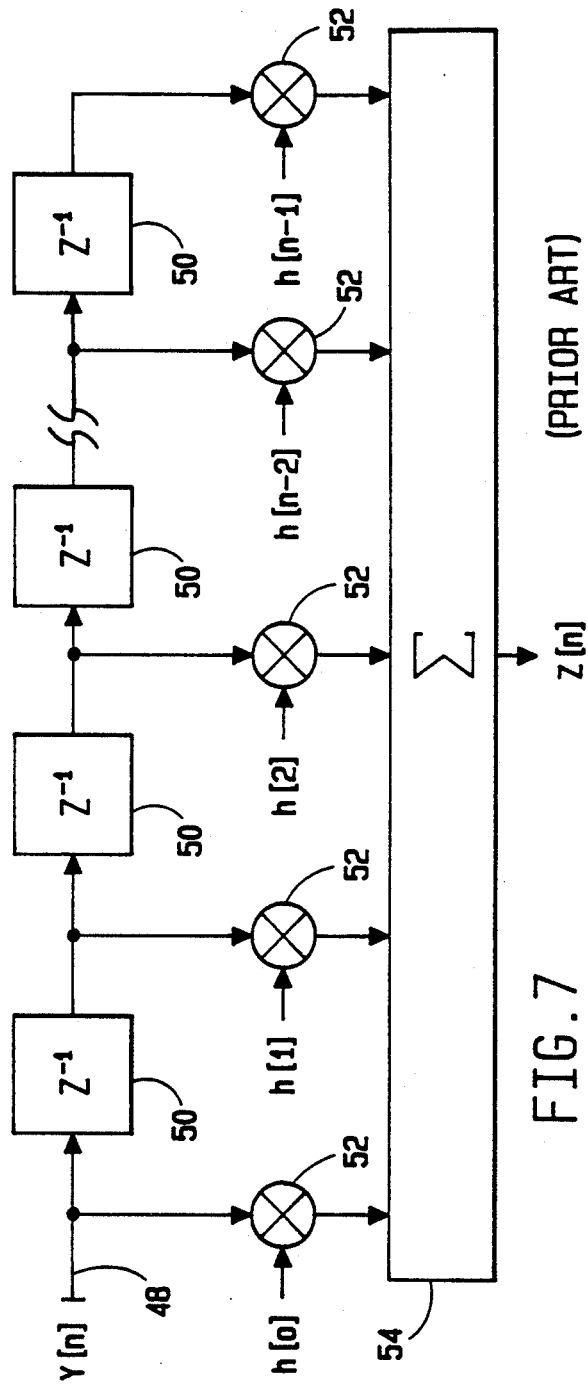
FIG. 7 illustrates a block diagram of the FIR interpolation filter.

Referring now to FIG. 7, there is illustrated a block diagram of a conventional FIR filter of filter length N. The input sequence y[n] is received on an input 48 and input to a sequence of delay blocks 50, each providing a delay of "$z^{-1}$". Input y[n] is also input to one of a series of multipliers 52, which input is multiplied by a FIR filter coefficient h[0]. The output of this multiplier 52 is then input to a summing block 54 to perform an addition operation. The output of each of the subsequent delay blocks 50 are also input to an associated one of the multipliers 52 and multiplied by successive ones of the filter coefficients. The output of each of the multipliers 52 is input to the summing circuit 54 that provides the addition operation. The output of the summing block 54 provides the output sequence z[n].

If the FIR coefficients are consistent with the design of a high precision FIR filter, they will have a word length in excess of fourteen bits. Whenever utilizing a multi-bit FIR coefficient, this results in the requirement for a relatively complex multiplication block. This is due to the fact that a number of shifting operations and addition operations will be required in accordance with conventional digital multiplication techniques. It is one important aspect of the present invention to reduce this complexity, if not eliminate it. In the preferred embodiment of the present invention, the FIR filter utilized to perform the low pass filtering function on the output of the interpolator to adequately attenuate the first out-of-band image is designed utilizing very trivial coefficients restricted to the set $\{-1, +1\}$ or $\{-1, 0, +1\}$.

With the coefficients restricted to the set $(-1, 0, +1)$, all that is needed is select circuitry that either selects a "0" value, the input value to the select block or the 2's complement of the input valve. This therefore requires no circuitry for shifting that would be evidenced in conventional digital multipliers. This is a significantly less complex operation. However, to obtain an adequate transition region and a flat pass band region while maintaining acceptable attenuation levels at the portion of the stop band proximate to the transition band, it is necessary to select the appropriate FIR coefficients.

It can be seen from the description above that the portion of the frequency response in the stop band proximate to the transition region and the pass band have been provided utilizing low precision FIR coefficients, which portion of the frequency response is substantially similar to that utilizing high precision FIR coefficients. However, the high frequency end of the stop band had a relatively poor stop band rejection with a gradually increasing frequency error which is not commensurate with that provided by high precision FIR coefficients. However, this rejection is achieved at a later stage in the circuitry, utilizing the output low pass filter. The result is that a multiplierless FIR filter has been provided to obtain acceptable pass band and transition band responses for filtering operation of the interpolation step with significant rejection in the portion of the stop band proximate to the transition band. This is a key aspect of the present invention.

The design of the sample rate converter and FIR filter is realized without the use of multipliers, as described above. As also described above, the interpolator essentially adds sixty-three zero's between the input data stream before it sends the converted data to the digital low pass filter. Of course, when a zero is multiplied by any coefficient, the output will be a zero that does not change in value. This means that any zeros that would be stored in the various delayed lines would essentially have no effect on the filter output. Therefore, conventional interpolator designs ignore the existence of zeros in the delay line outputs and therefore perform no mathematical operations thereon. For an n-bit input data stream and a filter having a length of a 2048, this would reduce the multiplications from 2048 to 32, with an interpolator factor of 64. This would result in only 32 multiplications and 32 additions. Therefore, only 32 m-bit shift registers would be required to hold non-zero data, which is an input to the interpolator.

With respect to the multiplication operations, these are replaced by three operations, an "ADD" operation, a "NO OPERATION" operation and a "SUBTRACT" operation, corresponding to the "1", "0" and "−1" coefficients. All that is needed therefore is to add or subtract the data from the output of the delay lines with the no multiplier requirement. Only a simple decoder is needed to decode the coefficient to know whether to add or to subtract the data from the final accumulator or to simply do nothing if the coefficient is zero.

In the preferred embodiment, the filter is designed to have a length of 2048 but only requires coefficients of 1792. Therefore, the remaining coefficients are set to zero. Table I illustrates how the data is accumulated, there being 64 outputs with 32 n-bit data cycled through such that, for example, the first m-bit non-zero input data X1 is first multiplied by coefficient one on the first output, then multiplied by coefficient two on the second output, etc. to fill in the 63 zeros that are interspersed between the first two samples. The remaining 31 m-bits non-zero input data are operated on in the same manner. This is conventional.

TABLE I

| (Coefficients) |
|---|
| 1 2 3 ... 64 65 66 67 ... 128 129 130 131 ... 1984 1985 1986 1987 ... 2048 |
| (Data in the Delay Blocks) |
| X1  0  0...0  X2  0  0...0  X3  0  0...0  X32  0  0...0 output1 |
| 0  X1  0...0  0  X2  0...0  0  X3  0...0  0  X32  0...0 output2 |
| 0  0  X1...0  0  0  X2...0  0  0  X3...0  0  0  X32...0 output3 |
| . |
| 0  0  0...X1  0  0  0...X2  0  0  0...X31  0  0  0...X32 output64 |

The equations that illustrate how the digital low pass filter calculate the outputs are illustrated in Table II.

TABLE II output 1 = X1 *coeff 1 + X2 *coeff 65 + ... + X32 *coeff 1985

TABLE II-continued output 2 = X1 *coeff 2 + X2 *coeff 66 + ... + X32 *coeff 1986
output 3 = X1 *coeff 3 + X2 *coeff 67 + ... + X32 *coeff 1987 output 64 = X1 *coeff 64 + X2 *coeff 128 + ... + X32 *coeff 2048

By the time the out-put 64 is generated, another new n-bit non-zero input data is entered. The oldest non-zero data is then discarded, the new data is put into the shift register and then the above operation is initiated. Since only 32 additions are needed to generate a single output, it is therefore only necessary to know the rate of the master clock to determine how many accumulators are required. If the master clock is $256 \times f_s$, only one accumulator is required to do four additions in one clock period of the $64 \times f_s$ clock. So, therefore, a minimum of eight accumulators are required in order to generate the output data at the $64 \times f_s$ rate.

Figure 8:
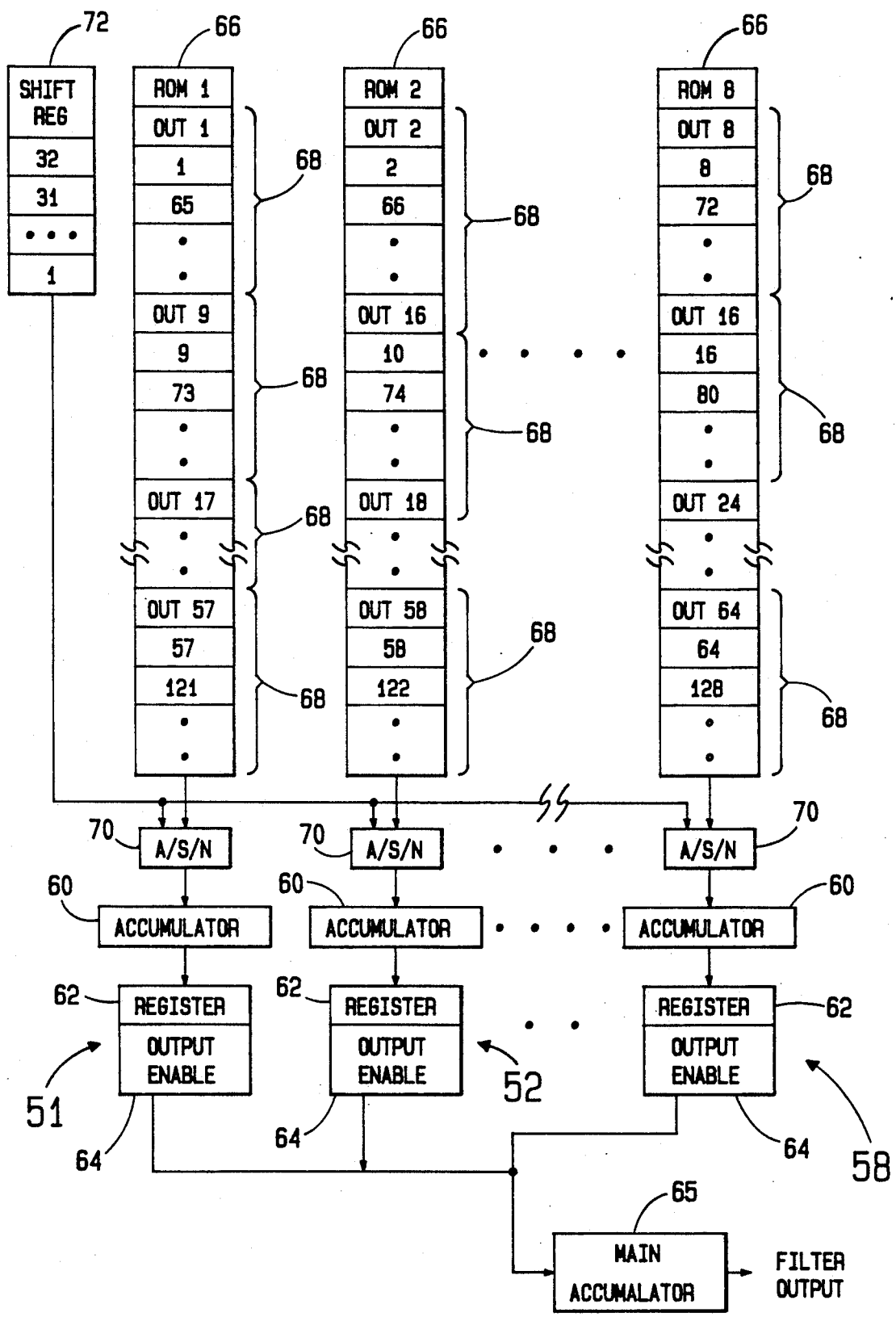
FIG. 8 illustrates a more detailed block diagram of the interpolator of the present invention.

Referring now to FIG. 8, there is illustrated a detailed block diagram of the conversion rate and filter operation of the present invention. To simplify the design, eight accumulators 60 are provided that are operable to accumulate eight separate output data at the same time, each accumulating different output data. At the end of every 32 master clocks, eight output data that are accumulated in the accumulator 60 are then ready for output. Each accumulator output is then latched to one of eight respective registers 62 in a parallel manner which are connected to the output of the respective accumulators 60. The accumulators 60 are then cleared and are then ready to accumulate the next eight output data. Output enable signals S1-S8 are utilized to enable the ones of the registers that are to send data out. These output enable signals change at the $64 \times f_s$ rate, or every four clock cycles of the master clock. The output data is then input to a main accumulator 65 to accumulate all outputs.

The coefficients are stored in eight ROMs 66, each ROM organized in eight sections 68, each section representing the coefficients for one of the outputs. Therefore, the first one of the ROMs 66 represents output 1, output 9 to output 57 with the second of the ROMs 66 representing output 2, output 16, output 18 through output 58. The output of the ROMs 66 are input to an operation circuit 70, the operation circuit 70 operable to perform a no change, a zeroing, or a negation function, depending upon the value of the coefficient which can a +1, 0 or −1, respectively. Therefore, the output of the ROM 66 provides a control function to the operation circuit 70. The other input of the operation circuit 70 is connected to the input data that is stored in a shift register 72, which is comprised of 32 17-bit registers.

In operation, in the first of the 32 master clock cycles, the first 17-bit data word associated with the first sample is input to the operation circuit 70 and the coefficients associated with the first eight outputs are selected from the ROMs 66 by generating the appropriate address. The results of these operations are input to the accumulator 60 for 32 operation cycles and, at the end of the first 32 master clock cycles, the outputs of the accumulators are latched into registers 62 and then the accumulators 60 are cleared. In the next 32 master clock cycles, the coefficients used to generate the outputs 9 through 16 are output by the ROMs 66, the accumulators 60 utilized to accumulate the output data and then this data stored in the register 62. This process is continued until all 64 output data have been generated. At this point, a new non-zero input data arrives from the differencing block and is stored into the register 72 and the operation begins again.

Figure 9:
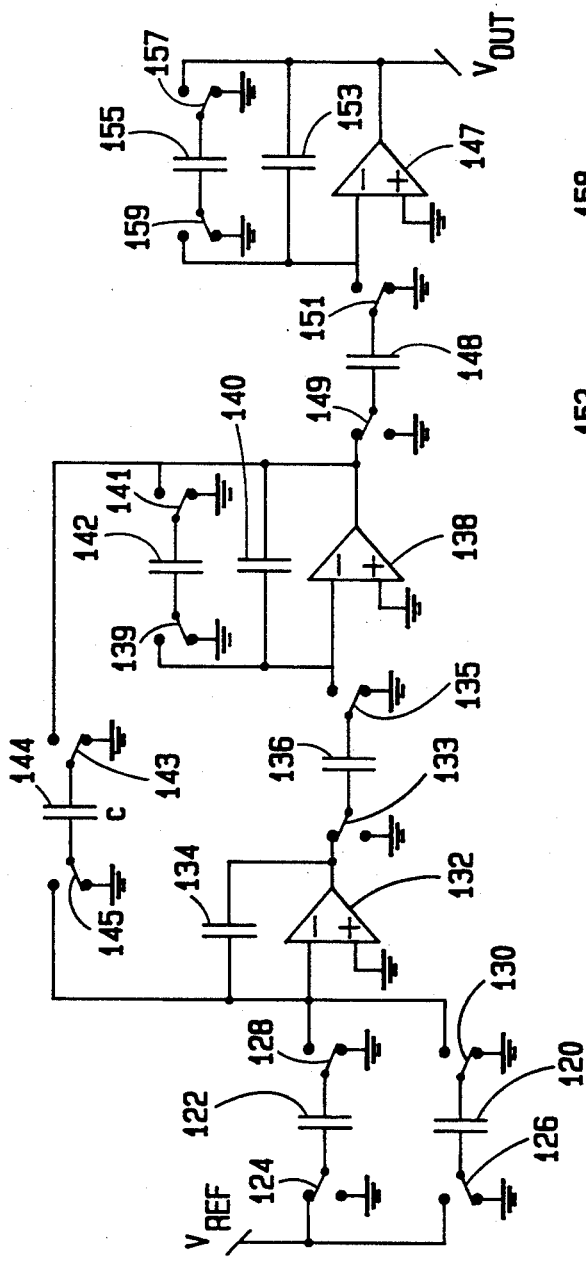
FIG. 9 illustrates a block diagram of the switched capacitor analog low pass filter and one-bit DAC utilized in the output section.

Referring now to FIG. 9, there is illustrated a detailed logic diagram of the switched capacitor filter 46 and the one-bit DAC. The one-bit DAC is comprised of a capacitor 120 and a capacitor 122 and voltage reference $V_{REF}$. Two switches 124 and 126 are provided, having two poles, one connected to $V_{REF}$, and one connected to ground. Each of the switches 124 and 126 has a switching arm connected to one side of capacitors 122 and 120, respectively. The other side of capacitors 122 and 120 are connected to the switching arms of switches 128 and 130. Switches 128 and 130 have two poles, one connected to ground and one connected to the input of a switched capacitor filter. In operation, capacitor 122 has one of its plates connected to the positive voltage and one of its plates connected to ground and then switches the one plate to ground and the other plate to the input of the switched capacitor filter. When the capacitor 122 is configured to have the one plate associated with switch 128 connected to ground and the one plate associated with switch 124 connected to the positive voltage, both plates of capacitor 120 are connected to ground. When the charge is transferred to the input of the switched capacitor filter, the one plate of capacitor 120 associated with switch 126 is connected to a positive voltage and the one plate of the capacitor 120 associated with switch 130 is connected to the input of the switched capacitor filter. This is a conventional 1-bit DAC.

The switched capacitor filter is a third order Butterworth low pass filter that is comprised of three switched capacitor stages. The first stage is comprised of an amplifier 132 having a negative input connected to one pole of switches 128 and 130 and the positive input thereof connected to ground. A capacitor 134 is connected between the output of amplifier 132 and the input thereof. A capacitor 136 has the plates thereof connected to the switching arms of switches 133 and 135. Capacitor 136 operates in a switched capacitor configuration with one plate tied to ground and the other plate tied to the non-ground pole. Switch 133 switches the one plate of capacitor 136 between the output of amplifier 132 and ground and switch 135 switches the other plate of capacitor 136 between the negative input of a second amplifier 138, associated with the second stage, and ground. The positive input of amplifier 138 is connected to ground. A capacitor 140 is connected between the negative input and the output of amplifier 138, and a switched capacitor 142 is disposed between the negative input and the output of amplifier 138 and switched between the input and output thereof and ground through switches 139 and 141, such that in one mode it is connected in parallel with capacitor 140 and, in another mode, has both plates connected to ground.

A switched capacitor 144 is connected between either the output of amplifier 138 and the negative input of amplifier 132 or ground through switches 143 and 145, such that either both plates are connected to ground or the capacitor is disposed across the output of amplifier 138 and the negative input of amplifier 132. A third amplifier stage 147 is provided, with a switched capacitor 148 connected in a switched configuration between the output of amplifier 138 and the negative input of amplifier 147 through switches 149 and 151. Switches 149 and 151 operate to connect one side of the capacitor to ground and the other side of the capacitor to the non-grounded pole. A capacitor 153 is disposed in parallel between the input and output of amplifier 147 and a switched capacitor 155 is connected in parallel with capacitor 153 through switches 157 and 159. Switches 157 and 159 operate to either connect both plates of capacitor 155 to ground or in parallel with capacitor 153. The output of amplifier 147 comprises the output of the third order filter.

In the preferred embodiment, the data is comprised of one-bit data output from the digital delta-sigma modulator, wherein switch 128 is closed as a function of the data input anded with a clock $\phi_2$, and the switch 130 is controlled by the anding of inverted data and clock signal $\phi_2$. This is a conventional operation. The switched capacitor filter operates on a sample rate equal to 64 $f_s$ and with a $-3$ dB frequency equal to $f_s/2$. The ratio utilized in the preferred embodiment for the capacitors are as follows:

| Capacitor | Ratio |
|---|---|
| 136 | 1 |
| 140 | 19.884 |
| 144 | 1 |
| 134 | 20.372 |
| 142 | 1 |
| 155 | 1 |
| 153 | 19.872 |
| 148 | 1 |
| 120 | 1 |
| 122 | 1 |

In order to determine what the low precision filter coefficients are for the present invention, it is first necessary to design the filter utilizing floating point precision FIR low pass filter coefficients. This is done utilizing a very conventional Parks-McClellan design, which coefficients are then processed through a software delta-sigma modulator or quantizer. The frequency response with the floating point coefficients would be as follows:

$$H(e^{j\omega}) = \sum_{n=-\infty}^{\infty} h[n]e^{-j\omega n} \qquad (3)$$

After processing through the software delta-sigma modulator, the following frequency response would occur:

$$\hat{H}(e^{j\omega}) = \sum_{n=-\infty}^{\infty} \hat{h}[n]e^{-j\omega n} \qquad (4)$$

This would result in the response of FIG. 3a. The software delta-sigma modulator is therefore utilized to truncate the floating point precision FIR coefficients to a very low or trivial level in a frequency selective manner, such that the frequency response error due to truncation is gradually concentrated to higher frequencies. This is illustrated by the gradual rise in frequency distortion illustrated in FIG. 3a.

Figure 10:
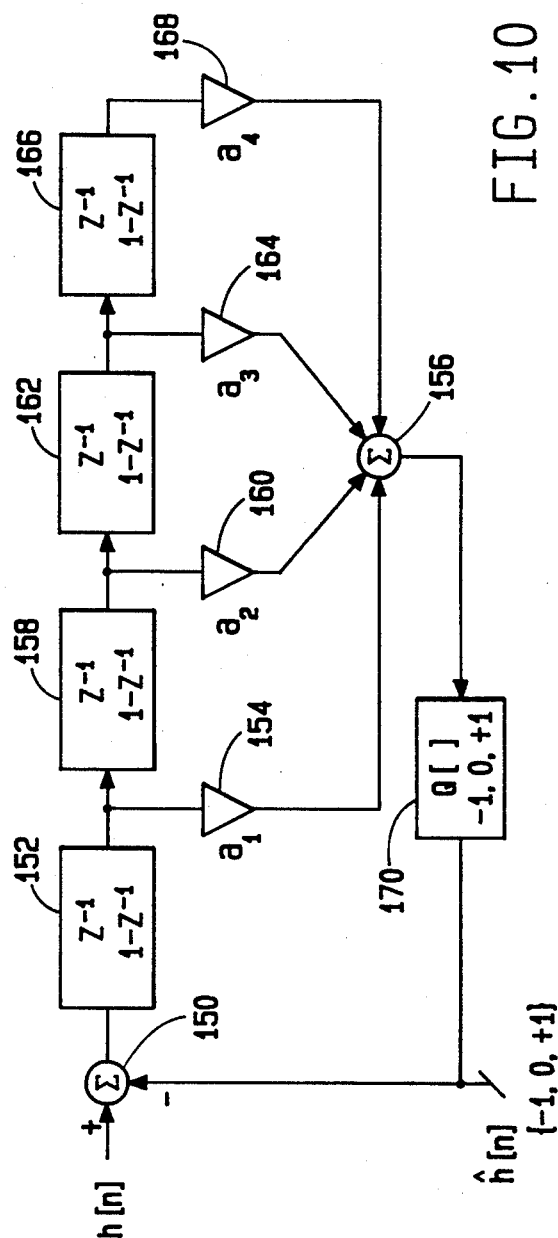
FIG. 10 illustrates a block diagram of the software delta-sigma modulator utilized to generate the low precision coefficients.

The truncation of the floating point precision FIR coefficients has been described in T. W. Wong and R. M. Gray, "FIR Filters with Sigma-Delta Modulation Encoding", *IEEE Trans. on Acous., Speech and Signal Processing*, Vol. 38, pp. 979–990, June 1990, which reference is incorporated herein by reference. Although this paper describes only a first or second order delta-sigma modulator, the preferred embodiment has utilized a fourth order software delta-sigma modulator to quantize the FIR coefficients. This is illustrated in FIG. 10. In FIG. 10, the floating point precision FIR coefficients h[n] are input to a summing block 150, the output of which is input to an accumulator 152. The input of the accumulator is input through a scaling device 154 to a summing block 156 and also to the input of a second accumulator 158. The output of accumulator 158 is input to the summing block 156 through a scaling block 160 and also to the input of a third accumulator 162. The output of the accumulator 162 is input through a scaling block 164 to the summing block 156 and also to the input of a fourth accumulator 166. The output of the fourth accumulator 166 is input through a scaling block 168 to the summing block 156. The summing block 156 sums the outputs of the scaling blocks 154, 160, 164 and 168 and inputs them to a quantizer 170. The quantizer 170 is operable to quantize the output of summing block 156 into the specified number of coefficients, which in the preferred embodiment is restricted to the set $\{-1, 0, +1\}$. The output of the quantizer 170 is then input to the summing block 150, the output of quantizer 170 also representing the low precision filter coefficients.

The state variables that exist at the output of each of the accumulator blocks 152, 158, 162 and 166 are set to an initial value of zero. This was described in the Wong and Gray reference. However, if the final value of the state variables is not equal to zero, this will result in quantization noise smearing. This can be understood by interpreting the finite length sequence of FIR coefficients as one period of a periodic sequence. Due to the non-linear nature of the Delta-Sigma encoder, the quantization error introduced when encoding a periodic input sequence will not, in general, be periodic. A rectangular window of length equal to one period must be applied to the Delta-Sigma output to isolate a set of low precision FIR coefficients. The consequence of the smearing that results from the existence of this rectangular window is that the stop band attenuation of the low precision coefficient FIR will be limited, since high frequency quantization noise will inevitably be smeared into the sensitive stop band region immediately following the transition band. The solution to this is to force periodicity in the delta-sigma output sequence by forcing the final value of the Delta-Sigma state variables to be equal to zero, which will result in a periodic low precision FIR coefficient sequence. By forcing equivalence of state variables initial and final values, the noise smearing effects of the rectangular window are nullified.

Figure 11:
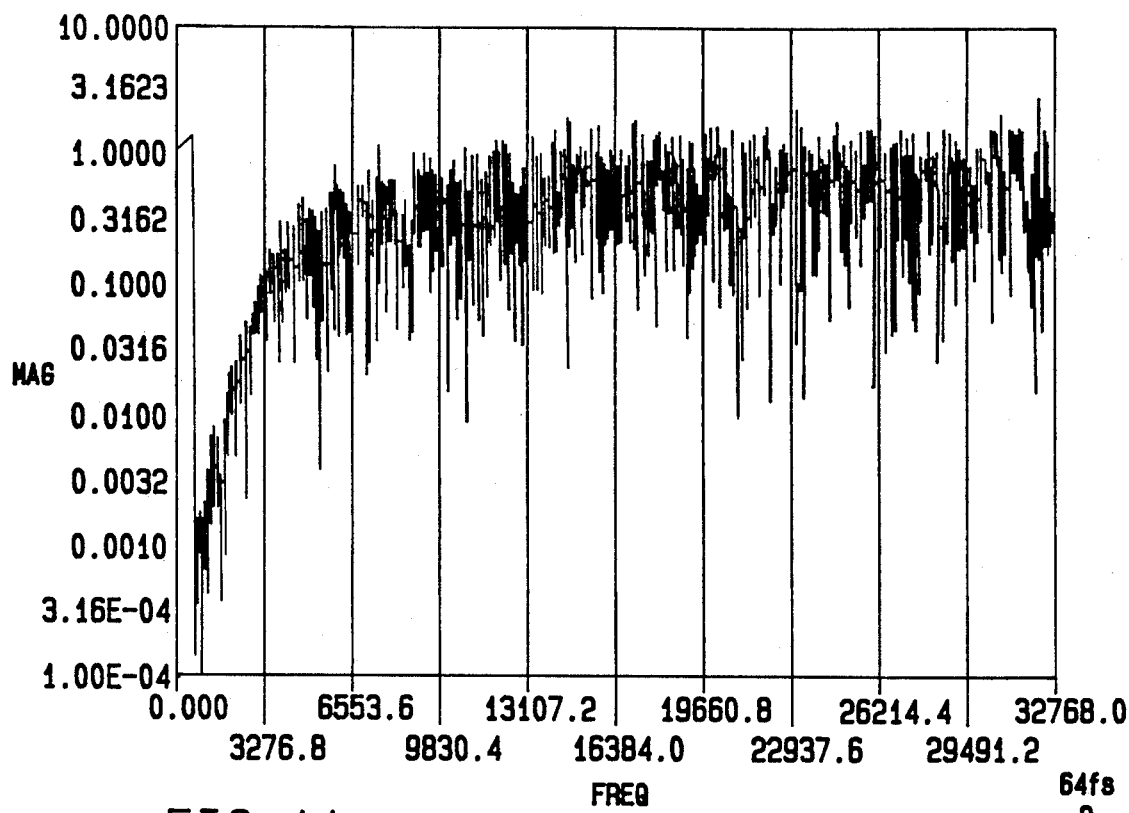
FIGS. 11-13 illustrate plots of the operation of the digital-to-analog converter utilizing two FIR filter coefficients in the set $\{-1, +1\}$.
Figure 12:
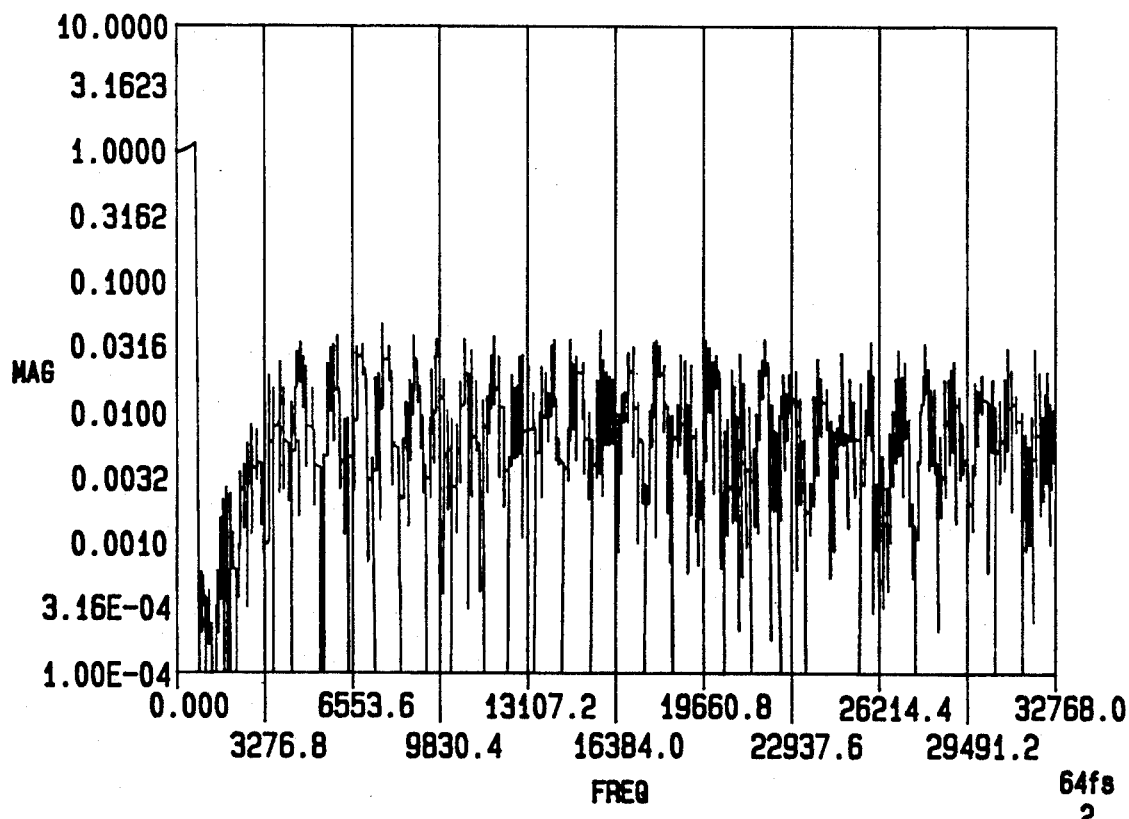
Figure 13:
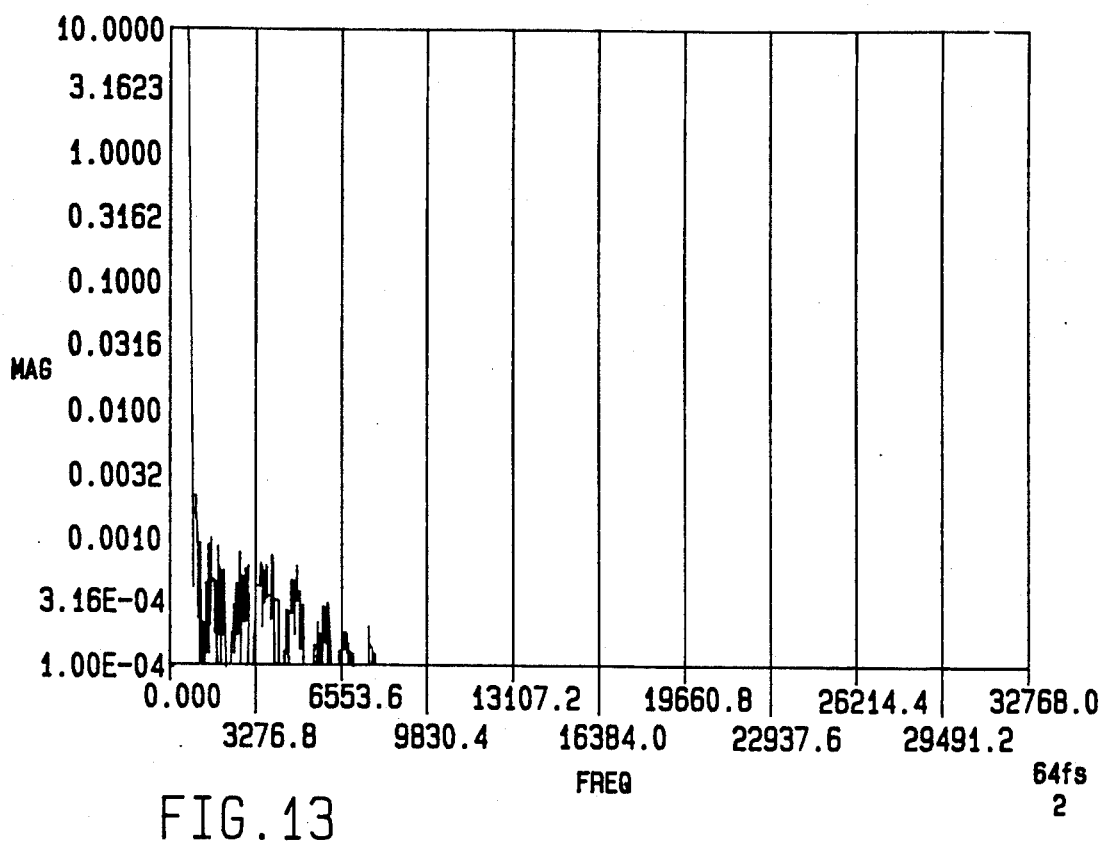

In one example, a 64× interpolation filter was designed, having a multiplier-free FIR length of 1792 taps. The FIR coefficients allowed were $-1$ and $+1$. The resulting coefficients are attached as Appendix A. FIG. 11 illustrates the response of the FIR filter 18 where it can be seen that significant stop band rejection is provided immediately after the transition band. It can also be seen that some peaking is provided at the end of the pass band to account for pass band droop as a result of the zero-order hold filter and also to compensate for any attenuation in the switched capacitor filter. FIG. 12 illustrates a plot at the output of the accumulator 42, illustrating further attenuation of the higher frequency images. It can be seen that the zero-order hold circuit places a number of zeroes at the images. FIG. 13 illustrates an overall response curve for the filter after the analog low pass filtering operation of the low pass filter.

Figure 14:
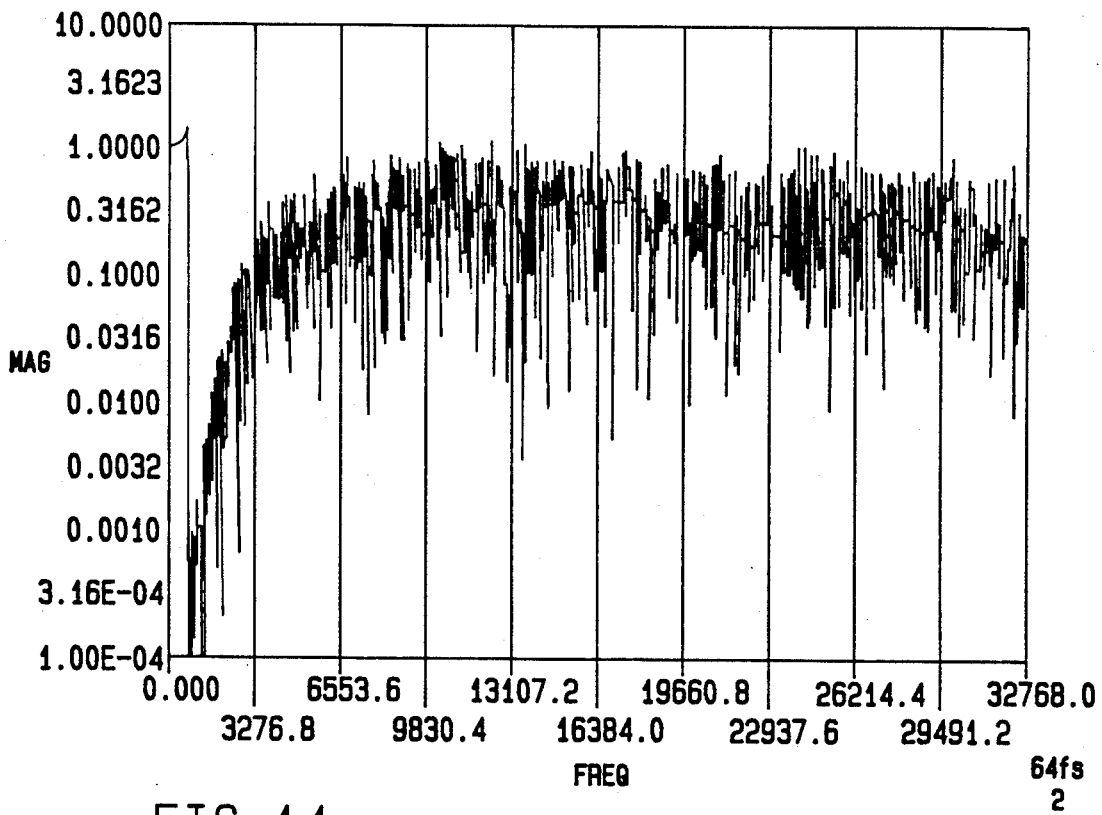
FIGS. 14-16 illustrate plots for an example utilizing FIR filter coefficients in the set $\{-1, 0, +1\}$.
Figure 15:
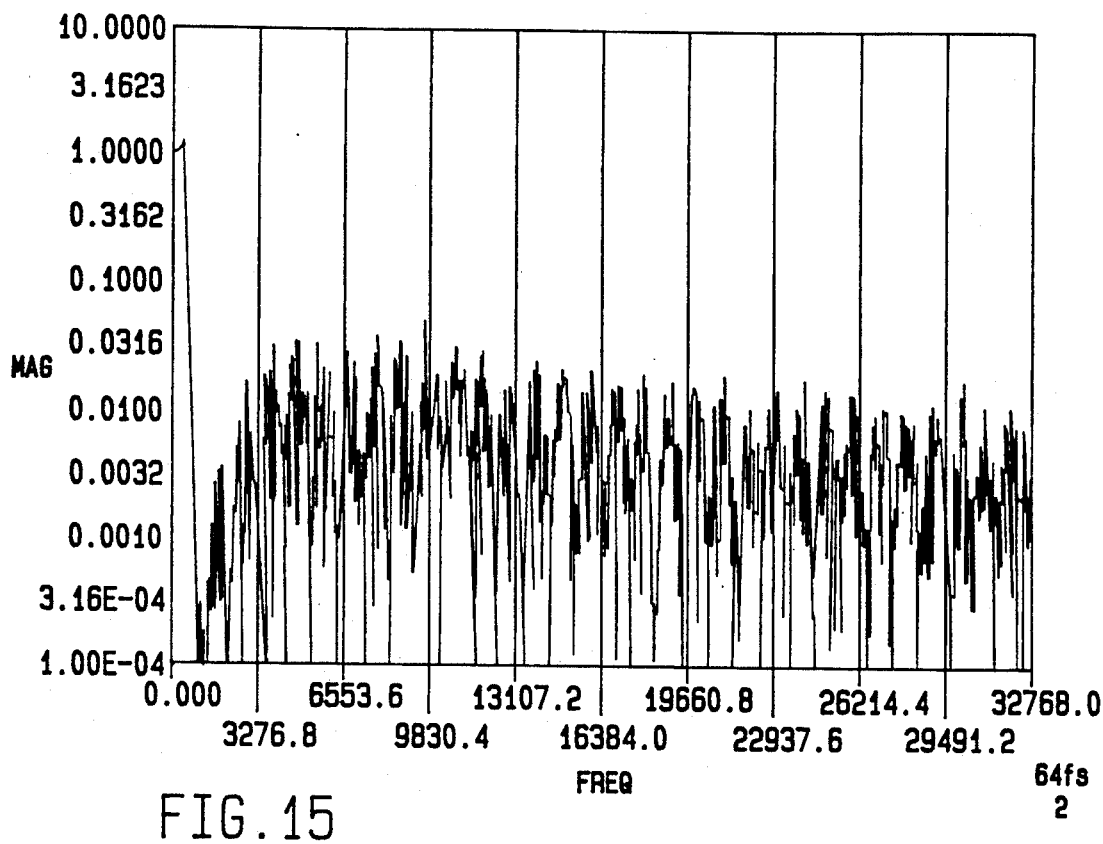
Figure 16:
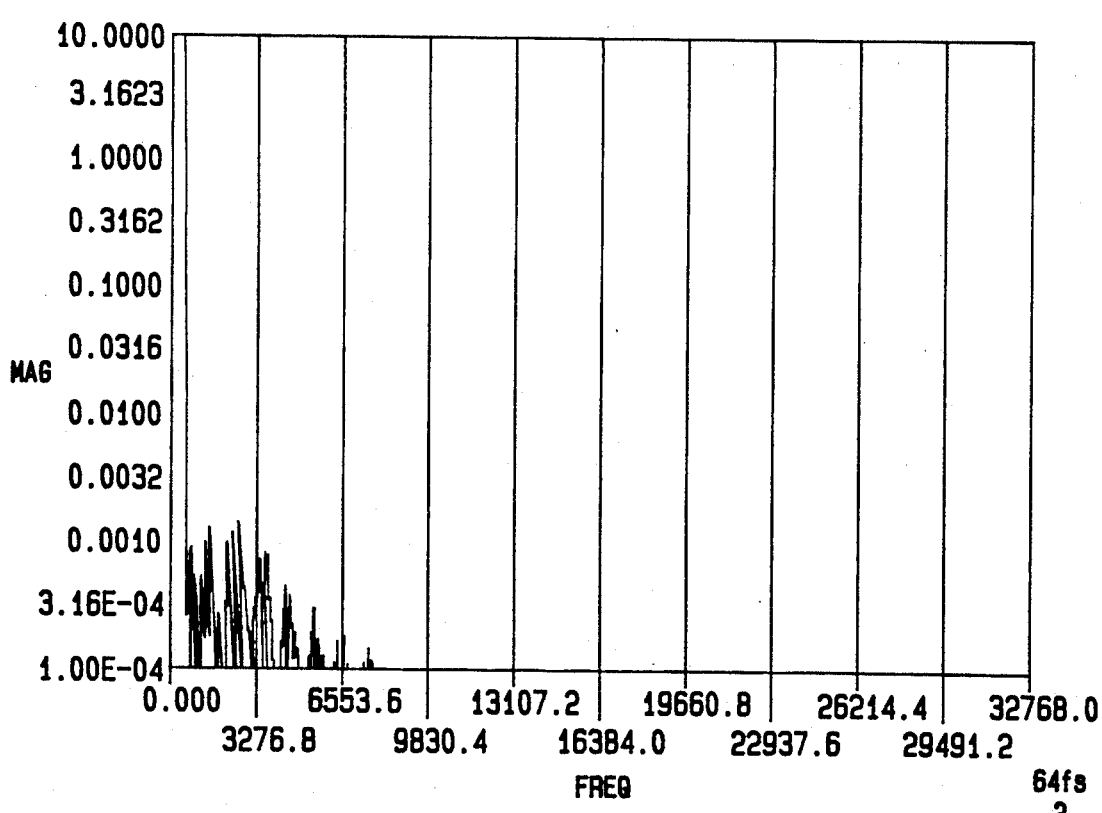

In a second example, the floating point precision coefficients were quantized to coefficients of −1, 0 and +1. The resulting coefficients are illustrated in Appendex B. FIG. 14 illustrates the frequency response at the output of the FIR low pass filter 18, illustrating a slightly better stop band rejection than that of FIG. 11. FIG. 15 illustrates the frequency response at the output of the accumulator 40 illustrating the rejection of the high frequency images. FIG. 16 illustrates the frequency response of the analog output, illustrating the overall pass band response. It can be seen that the stop band rejection is greater than 74 dB, which is quite acceptable for consumer applications. Further, the frequency response in the pass band and transition band are equivalent to that of the floating point precision FIR coefficient filter.

In summary, there has been provided an interpolation filter that operates with a minimal number of FIR coefficients. In the preferred embodiment, only three coefficients −1, 0 and +1 are utilized such that a multiplierless filter can be designed. The filter coefficients are designed such that the pass band and transition band are equivalent to that realizable with a substantially higher precision coefficient FIR filter, with the stop band rejection proximate to the transition band also being equivalent to that realizable with the higher precision coefficient FIR filter. However, the higher frequency portion of the stop band allows image energy to pass through in a gradually increasing manner such that the overall frequency response of the FIR filter is tuned. A subsequent analog low pass filter is utilized to filter out the high frequency image energy.

Although the preferred embodiment has been described in detail, it should be understood that various changes, substitutions and alterations can be made therein without departing from the spirit and scope of the invention as defined by the appended claims.

APPENDIX A

| | | | |
|---|---|---|---|
| h[ 0] = −1 | h[ 1] = 1 | h[ 2] = −1 | h[ 3] = 1 |
| h[ 4] = 1 | h[ 5] = −1 | h[ 6] = 1 | h[ 7] = −1 |
| h[ 8] = 1 | h[ 9] = −1 | h[ 10] = −1 | h[ 11] = 1 |
| h[ 12] = 1 | h[ 13] = −1 | h[ 14] = −1 | h[ 15] = 1 |
| h[ 16] = −1 | h[ 17] = 1 | h[ 18] = 1 | h[ 19] = −1 |
| h[ 20] = 1 | h[ 21] = −1 | h[ 22] = −1 | h[ 23] = 1 |
| h[ 24] = 1 | h[ 25] = −1 | h[ 26] = −1 | h[ 27] = 1 |
| h[ 28] = 1 | h[ 29] = −1 | h[ 30] = 1 | h[ 31] = −1 |
| h[ 32] = −1 | h[ 33] = 1 | h[ 34] = −1 | h[ 35] = 1 |
| h[ 36] = 1 | h[ 37] = −1 | h[ 38] = 1 | h[ 39] = −1 |
| h[ 40] = 1 | h[ 41] = −1 | h[ 42] = 1 | h[ 43] = −1 |
| h[ 44] = −1 | h[ 45] = 1 | h[ 46] = 1 | h[ 47] = −1 |
| h[ 48] = −1 | h[ 49] = 1 | h[ 50] = 1 | h[ 51] = −1 |
| h[ 52] = 1 | h[ 53] = −1 | h[ 54] = 1 | h[ 55] = −1 |
| h[ 56] = 1 | h[ 57] = −1 | h[ 58] = −1 | h[ 59] = 1 |
| h[ 60] = 1 | h[ 61] = −1 | h[ 62] = 1 | h[ 63] = −1 |
| h[ 64] = 1 | h[ 65] = −1 | h[ 66] = 1 | h[ 67] = −1 |
| h[ 68] = −1 | h[ 69] = 1 | h[ 70] = 1 | h[ 71] = −1 |
| h[ 72] = 1 | h[ 73] = −1 | h[ 74] = 1 | h[ 75] = −1 |
| h[ 76] = 1 | h[ 77] = −1 | h[ 78] = 1 | h[ 79] = −1 |
| h[ 80] = 1 | h[ 81] = −1 | h[ 82] = −1 | h[ 83] = 1 |
| h[ 84] = 1 | h[ 85] = −1 | h[ 86] = 1 | h[ 87] = −1 |
| h[ 88] = 1 | h[ 89] = −1 | h[ 90] = 1 | h[ 91] = −1 |
| h[ 92] = 1 | h[ 93] = −1 | h[ 94] = 1 | h[ 95] = −1 |
| h[ 96] = 1 | h[ 97] = −1 | h[ 98] = 1 | h[ 99] = −1 |
| h[100] = −1 | h[101] = 1 | h[102] = 1 | h[103] = −1 |
| h[104] = 1 | h[105] = −1 | h[106] = 1 | h[107] = −1 |
| h[108] = 1 | h[109] = −1 | h[110] = 1 | h[111] = −1 |
| h[112] = −1 | h[113] = 1 | h[114] = 1 | h[115] = −1 |
| h[116] = 1 | h[117] = −1 | h[118] = −1 | h[119] = 1 |
| h[120] = 1 | h[121] = −1 | h[122] = 1 | h[123] = −1 |
| h[124] = 1 | h[125] = −1 | h[126] = −1 | h[127] = 1 |
| h[128] = 1 | h[129] = −1 | h[130] = 1 | h[131] = −1 |
| h[132] = −1 | h[133] = 1 | h[134] = 1 | h[135] = −1 |
| h[136] = −1 | h[137] = 1 | h[138] = 1 | h[139] = −1 |
| h[140] = 1 | h[141] = −1 | h[142] = −1 | h[143] = 1 |
| h[144] = −1 | h[145] = 1 | h[146] = 1 | h[147] = −1 |
| h[148] = 1 | h[149] = −1 | h[150] = 1 | h[151] = −1 |
| h[152] = −1 | h[153] = 1 | h[154] = −1 | h[155] = 1 |
| h[156] = 1 | h[157] = −1 | h[158] = −1 | h[159] = 1 |
| h[160] = | h[161] = −1 | h[162] = 1 | h[163] = −1 |
| h[164] = | h[165] = 1 | h[166] = 1 | h[167] = −1 |
| h[168] = −1 | h[169] = 1 | h[170] = 1 | h[171] = −1 |

```
h[ 172] = -1      h[ 173] =  1      h[ 174] =  1      h[ 175] = -1
h[ 176] =  1      h[ 177] = -1      h[ 178] =  1      h[ 179] = -1
h[ 180] = -1      h[ 181] =  1      h[ 182] =  1      h[ 183] = -1
h[ 184] = -1      h[ 185] =  1      h[ 186] =  1      h[ 187] = -1
h[ 188] =  1      h[ 189] = -1      h[ 190] =  1      h[ 191] = -1
h[ 192] =  1      h[ 193] = -1      h[ 194] =  1      h[ 195] = -1
h[ 196] =  1      h[ 197] = -1      h[ 198] = -1      h[ 199] =  1
h[ 200] =  1      h[ 201] = -1      h[ 202] =  1      h[ 203] = -1
h[ 204] =  1      h[ 205] =  1      h[ 206] = -1      h[ 207] = -1
h[ 208] = -1      h[ 209] =  1      h[ 210] =  1      h[ 211] = -1
h[ 212] =  1      h[ 213] = -1      h[ 214] =  1      h[ 215] =  1
h[ 216] = -1      h[ 217] = -1      h[ 218] = -1      h[ 219] =  1
h[ 220] =  1      h[ 221] = -1      h[ 222] =  1      h[ 223] =  1
h[ 224] = -1      h[ 225] = -1      h[ 226] =  1      h[ 227] = -1
h[ 228] = -1      h[ 229] =  1      h[ 230] =  1      h[ 231] = -1
h[ 232] =  1      h[ 233] =  1      h[ 234] = -1      h[ 235] = -1
h[ 236] =  1      h[ 237] = -1      h[ 238] = -1      h[ 239] =  1
h[ 240] =  1      h[ 241] = -1      h[ 242] =  1      h[ 243] = -1
h[ 244] =  1      h[ 245] = -1      h[ 246] =  1      h[ 247] = -1
h[ 248] =  1      h[ 249] = -1      h[ 250] =  1      h[ 251] = -1
h[ 252] = -1      h[ 253] =  1      h[ 254] =  1      h[ 255] = -1
h[ 256] =  1      h[ 257] = -1      h[ 258] = -1      h[ 259] =  1
h[ 260] =  1      h[ 261] = -1      h[ 262] = -1      h[ 263] =  1
h[ 264] =  1      h[ 265] = -1      h[ 266] =  1      h[ 267] = -1
h[ 268] = -1      h[ 269] =  1      h[ 270] = -1      h[ 271] =  1
h[ 272] =  1      h[ 273] =  1      h[ 274] = -1      h[ 275] =  1
h[ 276] =  1      h[ 277] = -1      h[ 278] = -1      h[ 279] =  1
h[ 280] = -1      h[ 281] =  1      h[ 282] =  1      h[ 283] = -1
h[ 284] = -1      h[ 285] =  1      h[ 286] = -1      h[ 287] =  1
h[ 288] = -1      h[ 289] =  1      h[ 290] =  1      h[ 291] = -1
h[ 292] =  1      h[ 293] = -1      h[ 294] =  1      h[ 295] =  1
h[ 296] = -1      h[ 297] =  1      h[ 298] = -1      h[ 299] =  1
h[ 300] = -1      h[ 301] =  1      h[ 302] =  1      h[ 303] = -1
h[ 304] =  1      h[ 305] = -1      h[ 306] = -1      h[ 307] =  1
h[ 308] =  1      h[ 309] = -1      h[ 310] = -1      h[ 311] =  1
h[ 312] =  1      h[ 313] = -1      h[ 314] = -1      h[ 315] =  1
h[ 316] =  1      h[ 317] = -1      h[ 318] =  1      h[ 319] = -1
h[ 320] = -1      h[ 321] =  1      h[ 322] =  1      h[ 323] =  1
h[ 324] =  1      h[ 325] =  1      h[ 326] = -1      h[ 327] = -1
h[ 328] = -1      h[ 329] =  1      h[ 330] =  1      h[ 331] = -1
h[ 332] =  1      h[ 333] = -1      h[ 334] =  1      h[ 335] = -1
h[ 336] =  1      h[ 337] = -1      h[ 338] =  1      h[ 339] =  1
h[ 340] = -1      h[ 341] = -1      h[ 342] =  1      h[ 343] = -1
h[ 344] =  1      h[ 345] = -1      h[ 346] =  1      h[ 347] =  1
h[ 348] = -1      h[ 349] = -1      h[ 350] =  1      h[ 351] = -1
h[ 352] =  1      h[ 353] =  1      h[ 354] = -1      h[ 355] = -1
h[ 356] =  1      h[ 357] = -1      h[ 358] =  1      h[ 359] = -1
h[ 360] =  1      h[ 361] =  1      h[ 362] = -1      h[ 363] = -1
h[ 364] =  1      h[ 365] = -1      h[ 366] =  1      h[ 367] =  1
h[ 368] = -1      h[ 369] = -1      h[ 370] =  1      h[ 371] = -1
h[ 372] =  1      h[ 373] = -1      h[ 374] =  1      h[ 375] =  1
h[ 376] =  1      h[ 377] = -1      h[ 378] =  1      h[ 379] = -1
h[ 380] =  1      h[ 381] = -1      h[ 382] = -1      h[ 383] =  1
h[ 384] =  1      h[ 385] = -1      h[ 386] =  1      h[ 387] = -1
h[ 388] =  1      h[ 389] = -1      h[ 390] =  1      h[ 391] = -1
h[ 392] = -1      h[ 393] =  1      h[ 394] =  1      h[ 395] = -1
h[ 396] = -1      h[ 397] =  1      h[ 398] = -1      h[ 399] =  1
h[ 400] =  1      h[ 401] = -1      h[ 402] = -1      h[ 403] =  1
h[ 404] = -1      h[ 405] =  1      h[ 406] = -1      h[ 407] =  1
h[ 408] = -1      h[ 409] =  1      h[ 410] = -1      h[ 411] =  1
h[ 412] =  1      h[ 413] = -1      h[ 414] =  1      h[ 415] = -1
h[ 416] = -1      h[ 417] = -1      h[ 418] =  1      h[ 419] =  1
h[ 420] = -1      h[ 421] =  1      h[ 422] = -1      h[ 423] =  1
h[ 424] = -1      h[ 425] =  1      h[ 426] = -1      h[ 427] = -1
h[ 428] =  1      h[ 429] = -1      h[ 430] = -1      h[ 431] = -1
h[ 432] =  1      h[ 433] =  1      h[ 434] = -1      h[ 435] =  1
h[ 436] = -1      h[ 437] =  1      h[ 438] =  1      h[ 439] = -1
h[ 440] = -1      h[ 441] =  1      h[ 442] = -1      h[ 443] =  1
h[ 444] =  1      h[ 445] = -1      h[ 446] = -1      h[ 447] =  1
```

| | | | |
|---|---|---|---|
| h[ 448] = 1 | h[ 449] = -1 | h[ 450] = 1 | h[ 451] = -1 |
| h[ 452] = -1 | h[ 453] = -1 | h[ 454] = 1 | h[ 455] = -1 |
| h[ 456] = 1 | h[ 457] = -1 | h[ 458] = -1 | h[ 459] = 1 |
| h[ 460] = 1 | h[ 461] = 1 | h[ 462] = -1 | h[ 463] = -1 |
| h[ 464] = 1 | h[ 465] = 1 | h[ 466] = -1 | h[ 467] = -1 |
| h[ 468] = 1 | h[ 469] = -1 | h[ 470] = 1 | h[ 471] = 1 |
| h[ 472] = -1 | h[ 473] = -1 | h[ 474] = 1 | h[ 475] = 1 |
| h[ 476] = -1 | h[ 477] = 1 | h[ 478] = -1 | h[ 479] = -1 |
| h[ 480] = 1 | h[ 481] = 1 | h[ 482] = -1 | h[ 483] = 1 |
| h[ 484] = -1 | h[ 485] = -1 | h[ 486] = 1 | h[ 487] = 1 |
| h[ 488] = -1 | h[ 489] = 1 | h[ 490] = -1 | h[ 491] = 1 |
| h[ 492] = -1 | h[ 493] = 1 | h[ 494] = -1 | h[ 495] = 1 |
| h[ 496] = -1 | h[ 497] = -1 | h[ 498] = 1 | h[ 499] = 1 |
| h[ 500] = -1 | h[ 501] = -1 | h[ 502] = 1 | h[ 503] = 1 |
| h[ 504] = -1 | h[ 505] = -1 | h[ 506] = 1 | h[ 507] = 1 |
| h[ 508] = -1 | h[ 509] = -1 | h[ 510] = 1 | h[ 511] = -1 |
| h[ 512] = 1 | h[ 513] = 1 | h[ 514] = 1 | h[ 515] = -1 |
| h[ 516] = 1 | h[ 517] = -1 | h[ 518] = 1 | h[ 519] = -1 |
| h[ 520] = 1 | h[ 521] = -1 | h[ 522] = -1 | h[ 523] = 1 |
| h[ 524] = -1 | h[ 525] = 1 | h[ 526] = 1 | h[ 527] = -1 |
| h[ 528] = -1 | h[ 529] = 1 | h[ 530] = -1 | h[ 531] = 1 |
| h[ 532] = -1 | h[ 533] = 1 | h[ 534] = -1 | h[ 535] = 1 |
| h[ 536] = -1 | h[ 537] = 1 | h[ 538] = -1 | h[ 539] = 1 |
| h[ 540] = -1 | h[ 541] = -1 | h[ 542] = 1 | h[ 543] = 1 |
| h[ 544] = -1 | h[ 545] = -1 | h[ 546] = 1 | h[ 547] = -1 |
| h[ 548] = 1 | h[ 549] = 1 | h[ 550] = -1 | h[ 551] = -1 |
| h[ 552] = 1 | h[ 553] = -1 | h[ 554] = 1 | h[ 555] = -1 |
| h[ 556] = -1 | h[ 557] = -1 | h[ 558] = 1 | h[ 559] = -1 |
| h[ 560] = 1 | h[ 561] = 1 | h[ 562] = -1 | h[ 563] = 1 |
| h[ 564] = -1 | h[ 565] = -1 | h[ 566] = 1 | h[ 567] = 1 |
| h[ 568] = 1 | h[ 569] = 1 | h[ 570] = -1 | h[ 571] = 1 |
| h[ 572] = -1 | h[ 573] = 1 | h[ 574] = -1 | h[ 575] = -1 |
| h[ 576] = 1 | h[ 577] = 1 | h[ 578] = 1 | h[ 579] = -1 |
| h[ 580] = -1 | h[ 581] = 1 | h[ 582] = 1 | h[ 583] = -1 |
| h[ 584] = 1 | h[ 585] = -1 | h[ 586] = -1 | h[ 587] = 1 |
| h[ 588] = -1 | h[ 589] = -1 | h[ 590] = 1 | h[ 591] = -1 |
| h[ 592] = 1 | h[ 593] = -1 | h[ 594] = 1 | h[ 595] = 1 |
| h[ 596] = -1 | h[ 597] = 1 | h[ 598] = -1 | h[ 599] = 1 |
| h[ 600] = -1 | h[ 601] = -1 | h[ 602] = 1 | h[ 603] = 1 |
| h[ 604] = -1 | h[ 605] = 1 | h[ 606] = 1 | h[ 607] = -1 |
| h[ 608] = -1 | h[ 609] = 1 | h[ 610] = 1 | h[ 611] = -1 |
| h[ 612] = -1 | h[ 613] = 1 | h[ 614] = 1 | h[ 615] = -1 |
| h[ 616] = -1 | h[ 617] = 1 | h[ 618] = 1 | h[ 619] = -1 |
| h[ 620] = -1 | h[ 621] = 1 | h[ 622] = 1 | h[ 623] = -1 |
| h[ 624] = 1 | h[ 625] = -1 | h[ 626] = 1 | h[ 627] = -1 |
| h[ 628] = -1 | h[ 629] = 1 | h[ 630] = -1 | h[ 631] = 1 |
| h[ 632] = 1 | h[ 633] = -1 | h[ 634] = 1 | h[ 635] = -1 |
| h[ 636] = -1 | h[ 637] = -1 | h[ 638] = 1 | h[ 639] = 1 |
| h[ 640] = -1 | h[ 641] = 1 | h[ 642] = 1 | h[ 643] = -1 |
| h[ 644] = -1 | h[ 645] = -1 | h[ 646] = -1 | h[ 647] = 1 |
| h[ 648] = 1 | h[ 649] = 1 | h[ 650] = -1 | h[ 651] = -1 |
| h[ 652] = 1 | h[ 653] = -1 | h[ 654] = -1 | h[ 655] = 1 |
| h[ 656] = -1 | h[ 657] = 1 | h[ 658] = -1 | h[ 659] = 1 |
| h[ 660] = 1 | h[ 661] = -1 | h[ 662] = -1 | h[ 663] = -1 |
| h[ 664] = 1 | h[ 665] = -1 | h[ 666] = 1 | h[ 667] = -1 |
| h[ 668] = 1 | h[ 669] = -1 | h[ 670] = 1 | h[ 671] = -1 |
| h[ 672] = 1 | h[ 673] = -1 | h[ 674] = 1 | h[ 675] = -1 |
| h[ 676] = -1 | h[ 677] = 1 | h[ 678] = 1 | h[ 679] = -1 |
| h[ 680] = -1 | h[ 681] = -1 | h[ 682] = 1 | h[ 683] = 1 |
| h[ 684] = 1 | h[ 685] = -1 | h[ 686] = -1 | h[ 687] = 1 |
| h[ 688] = -1 | h[ 689] = -1 | h[ 690] = 1 | h[ 691] = 1 |
| h[ 692] = 1 | h[ 693] = -1 | h[ 694] = -1 | h[ 695] = 1 |
| h[ 696] = -1 | h[ 697] = 1 | h[ 698] = -1 | h[ 699] = 1 |
| h[ 700] = 1 | h[ 701] = -1 | h[ 702] = -1 | h[ 703] = 1 |
| h[ 704] = 1 | h[ 705] = -1 | h[ 706] = 1 | h[ 707] = -1 |
| h[ 708] = 1 | h[ 709] = 1 | h[ 710] = -1 | h[ 711] = -1 |
| h[ 712] = 1 | h[ 713] = 1 | h[ 714] = -1 | h[ 715] = 1 |
| h[ 716] = -1 | h[ 717] = 1 | h[ 718] = 1 | h[ 719] = -1 |
| h[ 720] = 1 | h[ 721] = -1 | h[ 722] = 1 | h[ 723] = -1 |

```
h[ 724] =  1    h[ 725] = -1    h[ 726] =  1    h[ 727] =  1
h[ 728] =  1    h[ 729] = -1    h[ 730] =  1    h[ 731] = -1
h[ 732] = -1    h[ 733] =  1    h[ 734] =  1    h[ 735] = -1
h[ 736] =  1    h[ 737] =  1    h[ 738] = -1    h[ 739] =  1
h[ 740] = -1    h[ 741] =  1    h[ 742] = -1    h[ 743] =  1
h[ 744] = -1    h[ 745] =  1    h[ 746] = -1    h[ 747] =  1
h[ 748] =  1    h[ 749] =  1    h[ 750] = -1    h[ 751] = -1
h[ 752] = -1    h[ 753] =  1    h[ 754] =  1    h[ 755] = -1
h[ 756] =  1    h[ 757] = -1    h[ 758] =  1    h[ 759] = -1
h[ 760] =  1    h[ 761] = -1    h[ 762] = -1    h[ 763] =  1
h[ 764] =  1    h[ 765] = -1    h[ 766] =  1    h[ 767] = -1
h[ 768] = -1    h[ 769] =  1    h[ 770] = -1    h[ 771] =  1
h[ 772] = -1    h[ 773] =  1    h[ 774] = -1    h[ 775] = -1
h[ 776] =  1    h[ 777] = -1    h[ 778] = -1    h[ 779] =  1
h[ 780] =  1    h[ 781] = -1    h[ 782] = -1    h[ 783] = -1
h[ 784] =  1    h[ 785] = -1    h[ 786] =  1    h[ 787] = -1
h[ 788] =  1    h[ 789] = -1    h[ 790] = -1    h[ 791] = -1
h[ 792] =  1    h[ 793] = -1    h[ 794] =  1    h[ 795] = -1
h[ 796] =  1    h[ 797] = -1    h[ 798] = -1    h[ 799] = -1
h[ 800] = -1    h[ 801] =  1    h[ 802] =  1    h[ 803] = -1
h[ 804] = -1    h[ 805] =  1    h[ 806] = -1    h[ 807] =  1
h[ 808] = -1    h[ 809] = -1    h[ 810] = -1    h[ 811] =  1
h[ 812] = -1    h[ 813] =  1    h[ 814] =  1    h[ 815] = -1
h[ 816] = -1    h[ 817] = -1    h[ 818] =  1    h[ 819] = -1
h[ 820] =  1    h[ 821] = -1    h[ 822] =  1    h[ 823] = -1
h[ 824] =  1    h[ 825] = -1    h[ 826] =  1    h[ 827] = -1
h[ 828] = -1    h[ 829] =  1    h[ 830] =  1    h[ 831] =  1
h[ 832] = -1    h[ 833] = -1    h[ 834] =  1    h[ 835] = -1
h[ 836] =  1    h[ 837] =  1    h[ 838] = -1    h[ 839] =  1
h[ 840] =  1    h[ 841] = -1    h[ 842] =  1    h[ 843] = -1
h[ 844] =  1    h[ 845] =  1    h[ 846] = -1    h[ 847] =  1
h[ 848] =  1    h[ 849] =  1    h[ 850] = -1    h[ 851] =  1
h[ 852] =  1    h[ 853] = -1    h[ 854] =  1    h[ 855] =  1
h[ 856] =  1    h[ 857] = -1    h[ 858] =  1    h[ 859] =  1
h[ 860] =  1    h[ 861] =  1    h[ 862] =  1    h[ 863] =  1
h[ 864] = -1    h[ 865] =  1    h[ 866] =  1    h[ 867] =  1
h[ 868] = -1    h[ 869] =  1    h[ 870] =  1    h[ 871] =  1
h[ 872] =  1    h[ 873] =  1    h[ 874] =  1    h[ 875] =  1
h[ 876] =  1    h[ 877] = -1    h[ 878] =  1    h[ 879] =  1
h[ 880] =  1    h[ 881] =  1    h[ 882] =  1    h[ 883] =  1
h[ 884] =  1    h[ 885] =  1    h[ 886] =  1    h[ 887] =  1
h[ 888] =  1    h[ 889] = -1    h[ 890] =  1    h[ 891] =  1
h[ 892] =  1    h[ 893] =  1    h[ 894] = -1    h[ 895] =  1
h[ 896] =  1    h[ 897] =  1    h[ 898] =  1    h[ 899] =  1
h[ 900] =  1    h[ 901] =  1    h[ 902] =  1    h[ 903] =  1
h[ 904] =  1    h[ 905] =  1    h[ 906] =  1    h[ 907] = -1
h[ 908] = -1    h[ 909] =  1    h[ 910] =  1    h[ 911] = -1
h[ 912] =  1    h[ 913] =  1    h[ 914] =  1    h[ 915] =  1
h[ 916] =  1    h[ 917] =  1    h[ 918] =  1    h[ 919] =  1
h[ 920] = -1    h[ 921] =  1    h[ 922] = -1    h[ 923] = -1
h[ 924] =  1    h[ 925] =  1    h[ 926] = -1    h[ 927] =  1
h[ 928] =  1    h[ 929] =  1    h[ 930] = -1    h[ 931] =  1
h[ 932] =  1    h[ 933] = -1    h[ 934] = -1    h[ 935] =  1
h[ 936] =  1    h[ 937] = -1    h[ 938] =  1    h[ 939] =  1
h[ 940] = -1    h[ 941] = -1    h[ 942] =  1    h[ 943] =  1
h[ 944] = -1    h[ 945] = -1    h[ 946] =  1    h[ 947] = -1
h[ 948] =  1    h[ 949] = -1    h[ 950] =  1    h[ 951] =  1
h[ 952] = -1    h[ 953] = -1    h[ 954] = -1    h[ 955] =
h[ 956] =  1    h[ 957] = -1    h[ 958] = -1    h[ 959] = -1
h[ 960] =  1    h[ 961] =  1    h[ 962] = -1    h[ 963] =  1
h[ 964] = -1    h[ 965] = -1    h[ 966] = -1    h[ 967] =  1
h[ 968] = -1    h[ 969] =  1    h[ 970] = -1    h[ 971] =  1
h[ 972] = -1    h[ 973] =  1    h[ 974] = -1    h[ 975] = -1
h[ 976] = -1    h[ 977] =  1    h[ 978] = -1    h[ 979] =  1
h[ 980] = -1    h[ 981] = -1    h[ 982] =  1    h[ 983] =  1
h[ 984] = -1    h[ 985] = -1    h[ 986] =  1    h[ 987] = -1
h[ 988] = -1    h[ 989] =  1    h[ 990] = -1    h[ 991] =  1
h[ 992] = -1    h[ 993] = -1    h[ 994] =  1    h[ 995] =  1
h[ 996] = -1    h[ 997] =  1    h[ 998] = -1    h[ 999] = -1
```

| | | | |
|---|---|---|---|
| h[1000] = 1 | h[1001] = -1 | h[1002] = -1 | h[1003] = 1 |
| h[1004] = 1 | h[1005] = -1 | h[1006] = 1 | h[1007] = 1 |
| h[1008] = -1 | h[1009] = -1 | h[1010] = -1 | h[1011] = 1 |
| h[1012] = 1 | h[1013] = -1 | h[1014] = -1 | h[1015] = 1 |
| h[1016] = 1 | h[1017] = 1 | h[1018] = -1 | h[1019] = -1 |
| h[1020] = 1 | h[1021] = 1 | h[1022] = 1 | h[1023] = -1 |
| h[1024] = 1 | h[1025] = 1 | h[1026] = -1 | h[1027] = 1 |
| h[1028] = -1 | h[1029] = 1 | h[1030] = 1 | h[1031] = -1 |
| h[1032] = -1 | h[1033] = 1 | h[1034] = 1 | h[1035] = 1 |
| h[1036] = 1 | h[1037] = 1 | h[1038] = -1 | h[1039] = -1 |
| h[1040] = 1 | h[1041] = 1 | h[1042] = -1 | h[1043] = 1 |
| h[1044] = -1 | h[1045] = 1 | h[1046] = 1 | h[1047] = -1 |
| h[1048] = 1 | h[1049] = -1 | h[1050] = 1 | h[1051] = -1 |
| h[1052] = 1 | h[1053] = -1 | h[1054] = 1 | h[1055] = 1 |
| h[1056] = -1 | h[1057] = -1 | h[1058] = 1 | h[1059] = 1 |
| h[1060] = 1 | h[1061] = -1 | h[1062] = -1 | h[1063] = 1 |
| h[1064] = 1 | h[1065] = -1 | h[1066] = -1 | h[1067] = 1 |
| h[1068] = -1 | h[1069] = 1 | h[1070] = 1 | h[1071] = -1 |
| h[1072] = 1 | h[1073] = -1 | h[1074] = -1 | h[1075] = 1 |
| h[1076] = 1 | h[1077] = -1 | h[1078] = -1 | h[1079] = -1 |
| h[1080] = 1 | h[1081] = -1 | h[1082] = -1 | h[1083] = 1 |
| h[1084] = 1 | h[1085] = -1 | h[1086] = -1 | h[1087] = 1 |
| h[1088] = -1 | h[1089] = 1 | h[1090] = -1 | h[1091] = 1 |
| h[1092] = 1 | h[1093] = -1 | h[1094] = -1 | h[1095] = -1 |
| h[1096] = 1 | h[1097] = 1 | h[1098] = -1 | h[1099] = -1 |
| h[1100] = 1 | h[1101] = -1 | h[1102] = 1 | h[1103] = -1 |
| h[1104] = 1 | h[1105] = 1 | h[1106] = -1 | h[1107] = -1 |
| h[1108] = -1 | h[1109] = 1 | h[1110] = -1 | h[1111] = 1 |
| h[1112] = -1 | h[1113] = 1 | h[1114] = -1 | h[1115] = 1 |
| h[1116] = -1 | h[1117] = 1 | h[1118] = -1 | h[1119] = -1 |
| h[1120] = 1 | h[1121] = 1 | h[1122] = -1 | h[1123] = -1 |
| h[1124] = 1 | h[1125] = -1 | h[1126] = 1 | h[1127] = -1 |
| h[1128] = 1 | h[1129] = -1 | h[1130] = 1 | h[1131] = -1 |
| h[1132] = 1 | h[1133] = -1 | h[1134] = -1 | h[1135] = 1 |
| h[1136] = -1 | h[1137] = 1 | h[1138] = 1 | h[1139] = -1 |
| h[1140] = 1 | h[1141] = -1 | h[1142] = 1 | h[1143] = -1 |
| h[1144] = -1 | h[1145] = 1 | h[1146] = -1 | h[1147] = 1 |
| h[1148] = 1 | h[1149] = -1 | h[1150] = 1 | h[1151] = -1 |
| h[1152] = -1 | h[1153] = 1 | h[1154] = 1 | h[1155] = -1 |
| h[1156] = 1 | h[1157] = -1 | h[1158] = 1 | h[1159] = -1 |
| h[1160] = -1 | h[1161] = 1 | h[1162] = 1 | h[1163] = 1 |
| h[1164] = -1 | h[1165] = 1 | h[1166] = -1 | h[1167] = -1 |
| h[1168] = 1 | h[1169] = 1 | h[1170] = -1 | h[1171] = -1 |
| h[1172] = 1 | h[1173] = 1 | h[1174] = -1 | h[1175] = 1 |
| h[1176] = 1 | h[1177] = -1 | h[1178] = -1 | h[1179] = 1 |
| h[1180] = -1 | h[1181] = 1 | h[1182] = 1 | h[1183] = -1 |
| h[1184] = -1 | h[1185] = 1 | h[1186] = 1 | h[1187] = -1 |
| h[1188] = 1 | h[1189] = -1 | h[1190] = 1 | h[1191] = -1 |
| h[1192] = 1 | h[1193] = -1 | h[1194] = 1 | h[1195] = 1 |
| h[1196] = -1 | h[1197] = -1 | h[1198] = 1 | h[1199] = -1 |
| h[1200] = 1 | h[1201] = 1 | h[1202] = -1 | h[1203] = -1 |
| h[1204] = 1 | h[1205] = 1 | h[1206] = -1 | h[1207] = -1 |
| h[1208] = 1 | h[1209] = 1 | h[1210] = -1 | h[1211] = -1 |
| h[1212] = 1 | h[1213] = 1 | h[1214] = -1 | h[1215] = -1 |
| h[1216] = 1 | h[1217] = 1 | h[1218] = -1 | h[1219] = 1 |
| h[1220] = -1 | h[1221] = -1 | h[1222] = 1 | h[1223] = -1 |
| h[1224] = 1 | h[1225] = -1 | h[1226] = 1 | h[1227] = -1 |
| h[1228] = 1 | h[1229] = -1 | h[1230] = 1 | h[1231] = -1 |
| h[1232] = 1 | h[1233] = -1 | h[1234] = 1 | h[1235] = -1 |
| h[1236] = 1 | h[1237] = -1 | h[1238] = 1 | h[1239] = -1 |
| h[1240] = -1 | h[1241] = 1 | h[1242] = -1 | h[1243] = 1 |
| h[1244] = 1 | h[1245] = -1 | h[1246] = -1 | h[1247] = 1 |
| h[1248] = -1 | h[1249] = 1 | h[1250] = -1 | h[1251] = 1 |
| h[1252] = -1 | h[1253] = 1 | h[1254] = -1 | h[1255] = 1 |
| h[1256] = -1 | h[1257] = -1 | h[1258] = 1 | h[1259] = 1 |
| h[1260] = -1 | h[1261] = -1 | h[1262] = 1 | h[1263] = 1 |
| h[1264] = -1 | h[1265] = -1 | h[1266] = 1 | h[1267] = 1 |
| h[1268] = -1 | h[1269] = -1 | h[1270] = 1 | h[1271] = 1 |
| h[1272] = -1 | h[1273] = -1 | h[1274] = 1 | h[1275] = -1 |

| | | | |
|---|---|---|---|
| h[1276] = 1 | h[1277] = -1 | h[1278] = 1 | h[1279] = 1 |
| h[1280] = -1 | h[1281] = -1 | h[1282] = 1 | h[1283] = 1 |
| h[1284] = -1 | h[1285] = -1 | h[1286] = 1 | h[1287] = -1 |
| h[1288] = 1 | h[1289] = 1 | h[1290] = -1 | h[1291] = -1 |
| h[1292] = 1 | h[1293] = 1 | h[1294] = -1 | h[1295] = -1 |
| h[1296] = 1 | h[1297] = 1 | h[1298] = -1 | h[1299] = 1 |
| h[1300] = -1 | h[1301] = 1 | h[1302] = -1 | h[1303] = 1 |
| h[1304] = -1 | h[1305] = 1 | h[1306] = -1 | h[1307] = 1 |
| h[1308] = -1 | h[1309] = 1 | h[1310] = -1 | h[1311] = 1 |
| h[1312] = -1 | h[1313] = 1 | h[1314] = -1 | h[1315] = -1 |
| h[1316] = 1 | h[1317] = -1 | h[1318] = -1 | h[1319] = 1 |
| h[1320] = -1 | h[1321] = 1 | h[1322] = 1 | h[1323] = -1 |
| h[1324] = -1 | h[1325] = 1 | h[1326] = 1 | h[1327] = -1 |
| h[1328] = 1 | h[1329] = -1 | h[1330] = 1 | h[1331] = -1 |
| h[1332] = 1 | h[1333] = -1 | h[1334] = 1 | h[1335] = -1 |
| h[1336] = 1 | h[1337] = -1 | h[1338] = 1 | h[1339] = -1 |
| h[1340] = -1 | h[1341] = 1 | h[1342] = 1 | h[1343] = 1 |
| h[1344] = -1 | h[1345] = -1 | h[1346] = -1 | h[1347] = 1 |
| h[1348] = 1 | h[1349] = -1 | h[1350] = 1 | h[1351] = 1 |
| h[1352] = -1 | h[1353] = -1 | h[1354] = -1 | h[1355] = 1 |
| h[1356] = 1 | h[1357] = -1 | h[1358] = 1 | h[1359] = -1 |
| h[1360] = -1 | h[1361] = 1 | h[1362] = 1 | h[1363] = -1 |
| h[1364] = 1 | h[1365] = -1 | h[1366] = 1 | h[1367] = -1 |
| h[1368] = -1 | h[1369] = 1 | h[1370] = -1 | h[1371] = 1 |
| h[1372] = 1 | h[1373] = -1 | h[1374] = 1 | h[1375] = -1 |
| h[1376] = -1 | h[1377] = 1 | h[1378] = -1 | h[1379] = 1 |
| h[1380] = -1 | h[1381] = 1 | h[1382] = -1 | h[1383] = 1 |
| h[1384] = -1 | h[1385] = -1 | h[1386] = -1 | h[1387] = 1 |
| h[1388] = -1 | h[1389] = -1 | h[1390] = 1 | h[1391] = 1 |
| h[1392] = 1 | h[1393] = -1 | h[1394] = -1 | h[1395] = -1 |
| h[1396] = 1 | h[1397] = 1 | h[1398] = -1 | h[1399] = 1 |
| h[1400] = -1 | h[1401] = 1 | h[1402] = -1 | h[1403] = 1 |
| h[1404] = -1 | h[1405] = -1 | h[1406] = 1 | h[1407] = 1 |
| h[1408] = -1 | h[1409] = 1 | h[1410] = -1 | h[1411] = 1 |
| h[1412] = -1 | h[1413] = -1 | h[1414] = 1 | h[1415] = 1 |
| h[1416] = -1 | h[1417] = 1 | h[1418] = -1 | h[1419] = 1 |
| h[1420] = -1 | h[1421] = 1 | h[1422] = -1 | h[1423] = -1 |
| h[1424] = 1 | h[1425] = 1 | h[1426] = -1 | h[1427] = 1 |
| h[1428] = -1 | h[1429] = 1 | h[1430] = -1 | h[1431] = 1 |
| h[1432] = -1 | h[1433] = 1 | h[1434] = -1 | h[1435] = 1 |
| h[1436] = -1 | h[1437] = 1 | h[1438] = 1 | h[1439] = -1 |
| h[1440] = -1 | h[1441] = 1 | h[1442] = -1 | h[1443] = -1 |
| h[1444] = 1 | h[1445] = 1 | h[1446] = 1 | h[1447] = -1 |
| h[1448] = 1 | h[1449] = -1 | h[1450] = -1 | h[1451] = 1 |
| h[1452] = -1 | h[1453] = 1 | h[1454] = -1 | h[1455] = 1 |
| h[1456] = 1 | h[1457] = -1 | h[1458] = -1 | h[1459] = 1 |
| h[1460] = 1 | h[1461] = -1 | h[1462] = 1 | h[1463] = -1 |
| h[1464] = -1 | h[1465] = 1 | h[1466] = 1 | h[1467] = -1 |
| h[1468] = -1 | h[1469] = 1 | h[1470] = 1 | h[1471] = -1 |
| h[1472] = -1 | h[1473] = 1 | h[1474] = -1 | h[1475] = -1 |
| h[1476] = 1 | h[1477] = -1 | h[1478] = 1 | h[1479] = -1 |
| h[1480] = -1 | h[1481] = 1 | h[1482] = -1 | h[1483] = 1 |
| h[1484] = 1 | h[1485] = -1 | h[1486] = 1 | h[1487] = -1 |
| h[1488] = 1 | h[1489] = -1 | h[1490] = -1 | h[1491] = 1 |
| h[1492] = 1 | h[1493] = -1 | h[1494] = -1 | h[1495] = 1 |
| h[1496] = -1 | h[1497] = 1 | h[1498] = 1 | h[1499] = -1 |
| h[1500] = 1 | h[1501] = -1 | h[1502] = -1 | h[1503] = 1 |
| h[1504] = -1 | h[1505] = 1 | h[1506] = 1 | h[1507] = -1 |
| h[1508] = -1 | h[1509] = 1 | h[1510] = -1 | h[1511] = 1 |
| h[1512] = 1 | h[1513] = -1 | h[1514] = -1 | h[1515] = 1 |
| h[1516] = -1 | h[1517] = 1 | h[1518] = -1 | h[1519] = 1 |
| h[1520] = 1 | h[1521] = -1 | h[1522] = -1 | h[1523] = 1 |
| h[1524] = -1 | h[1525] = 1 | h[1526] = -1 | h[1527] = -1 |
| h[1528] = 1 | h[1529] = 1 | h[1530] = 1 | h[1531] = -1 |
| h[1532] = -1 | h[1533] = 1 | h[1534] = -1 | h[1535] = 1 |
| h[1536] = 1 | h[1537] = -1 | h[1538] = -1 | h[1539] = -1 |
| h[1540] = 1 | h[1541] = 1 | h[1542] = -1 | h[1543] = 1 |
| h[1544] = -1 | h[1545] = 1 | h[1546] = -1 | h[1547] = 1 |
| h[1548] = -1 | h[1549] = 1 | h[1550] = -1 | h[1551] = 1 |

| | | | |
|---|---|---|---|
| h[1552] = -1 | h[1553] = 1 | h[1554] = -1 | h[1555] = 1 |
| h[1556] = -1 | h[1557] = 1 | h[1558] = 1 | h[1559] = -1 |
| h[1560] = -1 | h[1561] = -1 | h[1562] = 1 | h[1563] = 1 |
| h[1564] = -1 | h[1565] = 1 | h[1566] = 1 | h[1567] = -1 |
| h[1568] = -1 | h[1569] = 1 | h[1570] = -1 | h[1571] = 1 |
| h[1572] = -1 | h[1573] = 1 | h[1574] = -1 | h[1575] = 1 |
| h[1576] = 1 | h[1577] = -1 | h[1578] = -1 | h[1579] = 1 |
| h[1580] = -1 | h[1581] = 1 | h[1582] = -1 | h[1583] = 1 |
| h[1584] = -1 | h[1585] = 1 | h[1586] = 1 | h[1587] = -1 |
| h[1588] = -1 | h[1589] = 1 | h[1590] = -1 | h[1591] = 1 |
| h[1592] = 1 | h[1593] = -1 | h[1594] = -1 | h[1595] = 1 |
| h[1596] = 1 | h[1597] = -1 | h[1598] = -1 | h[1599] = 1 |
| h[1600] = 1 | h[1601] = -1 | h[1602] = -1 | h[1603] = 1 |
| h[1604] = -1 | h[1605] = 1 | h[1606] = 1 | h[1607] = -1 |
| h[1608] = -1 | h[1609] = 1 | h[1610] = -1 | h[1611] = 1 |
| h[1612] = 1 | h[1613] = -1 | h[1614] = 1 | h[1615] = -1 |
| h[1616] = -1 | h[1617] = 1 | h[1618] = -1 | h[1619] = 1 |
| h[1620] = 1 | h[1621] = -1 | h[1622] = -1 | h[1623] = 1 |
| h[1624] = 1 | h[1625] = -1 | h[1626] = -1 | h[1627] = 1 |
| h[1628] = 1 | h[1629] = -1 | h[1630] = -1 | h[1631] = 1 |
| h[1632] = -1 | h[1633] = 1 | h[1634] = 1 | h[1635] = -1 |
| h[1636] = -1 | h[1637] = 1 | h[1638] = -1 | h[1639] = 1 |
| h[1640] = 1 | h[1641] = -1 | h[1642] = -1 | h[1643] = 1 |
| h[1644] = -1 | h[1645] = 1 | h[1646] = 1 | h[1647] = -1 |
| h[1648] = -1 | h[1649] = 1 | h[1650] = -1 | h[1651] = 1 |
| h[1652] = -1 | h[1653] = 1 | h[1654] = 1 | h[1655] = -1 |
| h[1656] = -1 | h[1657] = 1 | h[1658] = -1 | h[1659] = 1 |
| h[1660] = -1 | h[1661] = 1 | h[1662] = -1 | h[1663] = 1 |
| h[1664] = 1 | h[1665] = -1 | h[1666] = -1 | h[1667] = 1 |
| h[1668] = -1 | h[1669] = 1 | h[1670] = -1 | h[1671] = 1 |
| h[1672] = -1 | h[1673] = 1 | h[1674] = -1 | h[1675] = 1 |
| h[1676] = -1 | h[1677] = 1 | h[1678] = 1 | h[1679] = -1 |
| h[1680] = -1 | h[1681] = 1 | h[1682] = -1 | h[1683] = 1 |
| h[1684] = -1 | h[1685] = 1 | h[1686] = -1 | h[1687] = 1 |
| h[1688] = -1 | h[1689] = 1 | h[1690] = -1 | h[1691] = 1 |
| h[1692] = -1 | h[1693] = 1 | h[1694] = 1 | h[1695] = -1 |
| h[1696] = -1 | h[1697] = 1 | h[1698] = -1 | h[1699] = 1 |
| h[1700] = -1 | h[1701] = 1 | h[1702] = -1 | h[1703] = 1 |
| h[1704] = -1 | h[1705] = 1 | h[1706] = -1 | h[1707] = 1 |
| h[1708] = 1 | h[1709] = -1 | h[1710] = -1 | h[1711] = 1 |
| h[1712] = -1 | h[1713] = 1 | h[1714] = 1 | h[1715] = -1 |
| h[1716] = -1 | h[1717] = 1 | h[1718] = -1 | h[1719] = 1 |
| h[1720] = -1 | h[1721] = 1 | h[1722] = -1 | h[1723] = 1 |
| h[1724] = -1 | h[1725] = 1 | h[1726] = 1 | h[1727] = -1 |
| h[1728] = 1 | h[1729] = -1 | h[1730] = -1 | h[1731] = 1 |
| h[1732] = -1 | h[1733] = 1 | h[1734] = -1 | h[1735] = 1 |
| h[1736] = 1 | h[1737] = -1 | h[1738] = -1 | h[1739] = 1 |
| h[1740] = -1 | h[1741] = 1 | h[1742] = 1 | h[1743] = -1 |
| h[1744] = -1 | h[1745] = 1 | h[1746] = 1 | h[1747] = -1 |
| h[1748] = -1 | h[1749] = 1 | h[1750] = -1 | h[1751] = 1 |
| h[1752] = 1 | h[1753] = -1 | h[1754] = 1 | h[1755] = -1 |
| h[1756] = -1 | h[1757] = 1 | h[1758] = -1 | h[1759] = 1 |
| h[1760] = -1 | h[1761] = 1 | h[1762] = 1 | h[1763] = -1 |
| h[1764] = 1 | h[1765] = -1 | h[1766] = -1 | h[1767] = 1 |
| h[1768] = 1 | h[1769] = -1 | h[1770] = -1 | h[1771] = 1 |
| h[1772] = -1 | h[1773] = 1 | h[1774] = 1 | h[1775] = -1 |
| h[1776] = 1 | h[1777] = -1 | h[1778] = -1 | h[1779] = 1 |
| h[1780] = -1 | h[1781] = 1 | h[1782] = 1 | h[1783] = -1 |
| h[1784] = 1 | h[1785] = -1 | h[1786] = -1 | h[1787] = 1 |
| h[1788] = 1 | h[1789] = -1 | h[1790] = -1 | h[1791] = 1 |

APPENDIX B

| | | | |
|---|---|---|---|
| h[ 0] = 0 | h[ 1] = 0 | h[ 2] = 0 | h[ 3] = 0 |
| h[ 4] = 0 | h[ 5] = 0 | h[ 6] = -1 | h[ 7] = 1 |
| h[ 8] = 0 | h[ 9] = 0 | h[ 10] = 0 | h[ 11] = 0 |
| h[ 12] = 0 | h[ 13] = 0 | h[ 14] = 1 | h[ 15] = 0 |

| | | | |
|---|---|---|---|
| h[ 16] = -1 | h[ 17] = 0 | h[ 18] = 0 | h[ 19] = 0 |
| h[ 20] = 0 | h[ 21] = 0 | h[ 22] = 0 | h[ 23] = 0 |
| h[ 24] = -1 | h[ 25] = 1 | h[ 26] = 0 | h[ 27] = 0 |
| h[ 28] = 0 | h[ 29] = 0 | h[ 30] = 0 | h[ 31] = 0 |
| h[ 32] = 0 | h[ 33] = 1 | h[ 34] = 0 | h[ 35] = -1 |
| h[ 36] = 0 | h[ 37] = 0 | h[ 38] = 0 | h[ 39] = 0 |
| h[ 40] = 0 | h[ 41] = 1 | h[ 42] = 0 | h[ 43] = -1 |
| h[ 44] = 0 | h[ 45] = 0 | h[ 46] = 0 | h[ 47] = -1 |
| h[ 48] = 1 | h[ 49] = 0 | h[ 50] = 0 | h[ 51] = 0 |
| h[ 52] = 0 | h[ 53] = 1 | h[ 54] = 0 | h[ 55] = -1 |
| h[ 56] = 0 | h[ 57] = 0 | h[ 58] = 1 | h[ 59] = 0 |
| h[ 60] = 0 | h[ 61] = -1 | h[ 62] = 0 | h[ 63] = 0 |
| h[ 64] = 0 | h[ 65] = 0 | h[ 66] = 0 | h[ 67] = 0 |
| h[ 68] = 0 | h[ 69] = 0 | h[ 70] = 1 | h[ 71] = 0 |
| h[ 72] = 0 | h[ 73] = -1 | h[ 74] = 0 | h[ 75] = 0 |
| h[ 76] = 0 | h[ 77] = 0 | h[ 78] = 1 | h[ 79] = 0 |
| h[ 80] = 0 | h[ 81] = -1 | h[ 82] = 0 | h[ 83] = 0 |
| h[ 84] = 0 | h[ 85] = 0 | h[ 86] = 1 | h[ 87] = 0 |
| h[ 88] = 0 | h[ 89] = -1 | h[ 90] = 0 | h[ 91] = 0 |
| h[ 92] = 0 | h[ 93] = 0 | h[ 94] = 0 | h[ 95] = 1 |
| h[ 96] = 0 | h[ 97] = 0 | h[ 98] = -1 | h[ 99] = 0 |
| h[ 100] = 0 | h[ 101] = 0 | h[ 102] = 0 | h[ 103] = 1 |
| h[ 104] = 0 | h[ 105] = -1 | h[ 106] = 0 | h[ 107] = 0 |
| h[ 108] = 0 | h[ 109] = 0 | h[ 110] = 1 | h[ 111] = 0 |
| h[ 112] = -1 | h[ 113] = 0 | h[ 114] = 0 | h[ 115] = 0 |
| h[ 116] = 0 | h[ 117] = 0 | h[ 118] = 1 | h[ 119] = 0 |
| h[ 120] = -1 | h[ 121] = 0 | h[ 122] = 0 | h[ 123] = 0 |
| h[ 124] = 0 | h[ 125] = 0 | h[ 126] = 0 | h[ 127] = 0 |
| h[ 128] = 0 | h[ 129] = 1 | h[ 130] = 0 | h[ 131] = -1 |
| h[ 132] = 0 | h[ 133] = 0 | h[ 134] = 0 | h[ 135] = 0 |
| h[ 136] = 0 | h[ 137] = -1 | h[ 138] = 1 | h[ 139] = 0 |
| h[ 140] = 0 | h[ 141] = 0 | h[ 142] = 0 | h[ 143] = 0 |
| h[ 144] = 1 | h[ 145] = 0 | h[ 146] = -1 | h[ 147] = 0 |
| h[ 148] = 0 | h[ 149] = 0 | h[ 150] = 0 | h[ 151] = 0 |
| h[ 152] = 0 | h[ 153] = 0 | h[ 154] = -1 | h[ 155] = 0 |
| h[ 156] = 1 | h[ 157] = 0 | h[ 158] = 1 | h[ 159] = 0 |
| h[ 160] = -1 | h[ 161] = 0 | h[ 162] = 0 | h[ 163] = 0 |
| h[ 164] = 0 | h[ 165] = 0 | h[ 166] = 0 | h[ 167] = 0 |
| h[ 168] = 1 | h[ 169] = ? | h[ 170] = -1 | h[ 171] = 0 |
| h[ 172] = -1 | h[ 173] = 0 | h[ 174] = 1 | h[ 175] = 0 |
| h[ 176] = 0 | h[ 177] = 0 | h[ 178] = 1 | h[ 179] = 0 |
| h[ 180] = 0 | h[ 181] = -1 | h[ 182] = 0 | h[ 183] = 0 |
| h[ 184] = 0 | h[ 185] = 0 | h[ 186] = 0 | h[ 187] = 0 |
| h[ 188] = 0 | h[ 189] = 0 | h[ 190] = 0 | h[ 191] = 0 |
| h[ 192] = 1 | h[ 193] = 0 | h[ 194] = 0 | h[ 195] = -1 |
| h[ 196] = 0 | h[ 197] = 1 | h[ 198] = 0 | h[ 199] = -1 |
| h[ 200] = 0 | h[ 201] = 0 | h[ 202] = 0 | h[ 203] = 0 |
| h[ 204] = 1 | h[ 205] = 0 | h[ 206] = 0 | h[ 207] = -1 |
| h[ 208] = 0 | h[ 209] = 0 | h[ 210] = 1 | h[ 211] = 0 |
| h[ 212] = 0 | h[ 213] = -1 | h[ 214] = 0 | h[ 215] = 0 |
| h[ 216] = 1 | h[ 217] = 0 | h[ 218] = -1 | h[ 219] = 0 |
| h[ 220] = 0 | h[ 221] = 1 | h[ 222] = 0 | h[ 223] = 0 |
| h[ 224] = 0 | h[ 225] = -1 | h[ 226] = 0 | h[ 227] = 0 |
| h[ 228] = 0 | h[ 229] = 1 | h[ 230] = 0 | h[ 231] = 0 |
| h[ 232] = 0 | h[ 233] = -1 | h[ 234] = 0 | h[ 235] = 0 |
| h[ 236] = 0 | h[ 237] = 0 | h[ 238] = 1 | h[ 239] = 0 |
| h[ 240] = 0 | h[ 241] = -1 | h[ 242] = 0 | h[ 243] = 0 |
| h[ 244] = 0 | h[ 245] = 1 | h[ 246] = 0 | h[ 247] = -1 |
| h[ 248] = 0 | h[ 249] = 0 | h[ 250] = 0 | h[ 251] = 0 |
| h[ 252] = 1 | h[ 253] = 0 | h[ 254] = -1 | h[ 255] = 0 |
| h[ 256] = 0 | h[ 257] = 0 | h[ 258] = 0 | h[ 259] = 0 |
| h[ 260] = 0 | h[ 261] = 0 | h[ 262] = 0 | h[ 263] = 0 |
| h[ 264] = 0 | h[ 265] = 0 | h[ 266] = 0 | h[ 267] = 0 |
| h[ 268] = 0 | h[ 269] = 0 | h[ 270] = 0 | h[ 271] = 0 |
| h[ 272] = 0 | h[ 273] = 0 | h[ 274] = 0 | h[ 275] = 0 |
| h[ 276] = 0 | h[ 277] = 0 | h[ 278] = 0 | h[ 279] = 0 |
| h[ 280] = 0 | h[ 281] = 0 | h[ 282] = -1 | h[ 283] = 0 |
| h[ 284] = 1 | h[ 285] = 0 | h[ 286] = 0 | h[ 287] = 0 |
| h[ 288] = 0 | h[ 289] = 0 | h[ 290] = 0 | h[ 291] = -1 |
| h[ 292] = 0 | h[ 293] = 1 | h[ 294] = 0 | h[ 295] = 0 |

| | | | |
|---|---|---|---|
| h[ 296] = 0 | h[ 297] = 0 | h[ 298] = 0 | h[ 299] = 0 |
| h[ 300] = 1 | h[ 301] = -1 | h[ 302] = 0 | h[ 303] = 0 |
| h[ 304] = 0 | h[ 305] = 0 | h[ 306] = 0 | h[ 307] = 0 |
| h[ 308] = -1 | h[ 309] = 0 | h[ 310] = 1 | h[ 311] = 0 |
| h[ 312] = 0 | h[ 313] = 0 | h[ 314] = 0 | h[ 315] = 1 |
| h[ 316] = 0 | h[ 317] = 0 | h[ 318] = -1 | h[ 319] = 0 |
| h[ 320] = 0 | h[ 321] = 0 | h[ 322] = 0 | h[ 323] = 0 |
| h[ 324] = 0 | h[ 325] = 0 | h[ 326] = 1 | h[ 327] = 0 |
| h[ 328] = 0 | h[ 329] = -1 | h[ 330] = 0 | h[ 331] = 0 |
| h[ 332] = 1 | h[ 333] = 0 | h[ 334] = 0 | h[ 335] = 0 |
| h[ 336] = -1 | h[ 337] = 0 | h[ 338] = 0 | h[ 339] = 1 |
| h[ 340] = 0 | h[ 341] = 0 | h[ 342] = -1 | h[ 343] = 0 |
| h[ 344] = 1 | h[ 345] = 0 | h[ 346] = 0 | h[ 347] = 0 |
| h[ 348] = 0 | h[ 349] = 0 | h[ 350] = 0 | h[ 351] = -1 |
| h[ 352] = 0 | h[ 353] = 1 | h[ 354] = 0 | h[ 355] = 0 |
| h[ 356] = 0 | h[ 357] = -1 | h[ 358] = 0 | h[ 359] = 1 |
| h[ 360] = 0 | h[ 361] = 0 | h[ 362] = 0 | h[ 363] = 0 |
| h[ 364] = 0 | h[ 365] = 0 | h[ 366] = 0 | h[ 367] = 0 |
| h[ 368] = -1 | h[ 369] = 0 | h[ 370] = 0 | h[ 371] = 0 |
| h[ 372] = 1 | h[ 373] = 0 | h[ 374] = 0 | h[ 375] = 0 |
| h[ 376] = -1 | h[ 377] = 0 | h[ 378] = 0 | h[ 379] = 0 |
| h[ 380] = 1 | h[ 381] = 0 | h[ 382] = 0 | h[ 383] = -1 |
| h[ 384] = 0 | h[ 385] = 0 | h[ 386] = 0 | h[ 387] = 0 |
| h[ 388] = 0 | h[ 389] = 0 | h[ 390] = 0 | h[ 391] = 0 |
| h[ 392] = 1 | h[ 393] = -1 | h[ 394] = 0 | h[ 395] = 0 |
| h[ 396] = 0 | h[ 397] = 0 | h[ 398] = 0 | h[ 399] = 0 |
| h[ 400] = 0 | h[ 401] = 0 | h[ 402] = -1 | h[ 403] = 0 |
| h[ 404] = 0 | h[ 405] = 1 | h[ 406] = 0 | h[ 407] = 0 |
| h[ 408] = 0 | h[ 409] = -1 | h[ 410] = 0 | h[ 411] = 1 |
| h[ 412] = 0 | h[ 413] = 0 | h[ 414] = -1 | h[ 415] = 0 |
| h[ 416] = 0 | h[ 417] = 1 | h[ 418] = 0 | h[ 419] = 0 |
| h[ 420] = 0 | h[ 421] = -1 | h[ 422] = 0 | h[ 423] = 0 |
| h[ 424] = 1 | h[ 425] = 0 | h[ 426] = 0 | h[ 427] = -1 |
| h[ 428] = 0 | h[ 429] = 0 | h[ 430] = 1 | h[ 431] = 0 |
| h[ 432] = 0 | h[ 433] = -1 | h[ 434] = 0 | h[ 435] = 1 |
| h[ 436] = 0 | h[ 437] = 0 | h[ 438] = 0 | h[ 439] = -1 |
| h[ 440] = 0 | h[ 441] = 1 | h[ 442] = 0 | h[ 443] = 0 |
| h[ 444] = 0 | h[ 445] = 0 | h[ 446] = 0 | h[ 447] = 1 |
| h[ 448] = 0 | h[ 449] = -1 | h[ 450] = 0 | h[ 451] = 0 |
| h[ 452] = 0 | h[ 453] = -1 | h[ 454] = 1 | h[ 455] = 0 |
| h[ 456] = 0 | h[ 457] = 0 | h[ 458] = 1 | h[ 459] = 0 |
| h[ 460] = 0 | h[ 461] = 0 | h[ 462] = 0 | h[ 463] = -1 |
| h[ 464] = 0 | h[ 465] = 1 | h[ 466] = 0 | h[ 467] = 0 |
| h[ 468] = 0 | h[ 469] = 0 | h[ 470] = 0 | h[ 471] = 0 |
| h[ 472] = 0 | h[ 473] = 0 | h[ 474] = 0 | h[ 475] = 0 |
| h[ 476] = 0 | h[ 477] = 0 | h[ 478] = 0 | h[ 479] = -1 |
| h[ 480] = 1 | h[ 481] = 0 | h[ 482] = 0 | h[ 483] = 0 |
| h[ 484] = 1 | h[ 485] = 0 | h[ 486] = -1 | h[ 487] = 0 |
| h[ 488] = 0 | h[ 489] = 1 | h[ 490] = 0 | h[ 491] = -1 |
| h[ 492] = 0 | h[ 493] = 0 | h[ 494] = 0 | h[ 495] = 0 |
| h[ 496] = 0 | h[ 497] = 0 | h[ 498] = 0 | h[ 499] = 0 |
| h[ 500] = 0 | h[ 501] = 0 | h[ 502] = 0 | h[ 503] = 0 |
| h[ 504] = 0 | h[ 505] = 0 | h[ 506] = 0 | h[ 507] = 0 |
| h[ 508] = 0 | h[ 509] = -1 | h[ 510] = 0 | h[ 511] = 1 |
| h[ 512] = 0 | h[ 513] = 0 | h[ 514] = -1 | h[ 515] = 0 |
| h[ 516] = 0 | h[ 517] = 0 | h[ 518] = 1 | h[ 519] = 0 |
| h[ 520] = -1 | h[ 521] = 0 | h[ 522] = 0 | h[ 523] = 0 |
| h[ 524] = 0 | h[ 525] = 0 | h[ 526] = 0 | h[ 527] = 0 |
| h[ 528] = -1 | h[ 529] = 0 | h[ 530] = 1 | h[ 531] = 0 |
| h[ 532] = 0 | h[ 533] = -1 | h[ 534] = 0 | h[ 535] = 0 |
| h[ 536] = 0 | h[ 537] = 1 | h[ 538] = 0 | h[ 539] = 0 |
| h[ 540] = -1 | h[ 541] = 0 | h[ 542] = 0 | h[ 543] = 0 |
| h[ 544] = 0 | h[ 545] = 0 | h[ 546] = 0 | h[ 547] = -1 |
| h[ 548] = 0 | h[ 549] = 1 | h[ 550] = 0 | h[ 551] = 0 |
| h[ 552] = 1 | h[ 553] = 0 | h[ 554] = -1 | h[ 555] = 0 |
| h[ 556] = 0 | h[ 557] = 0 | h[ 558] = -1 | h[ 559] = 0 |
| h[ 560] = 1 | h[ 561] = 0 | h[ 562] = 0 | h[ 563] = 0 |
| h[ 564] = 0 | h[ 565] = 0 | h[ 566] = 0 | h[ 567] = 1 |
| h[ 568] = 0 | h[ 569] = -1 | h[ 570] = 0 | h[ 571] = 0 |
| h[ 572] = 0 | h[ 573] = 1 | h[ 574] = 0 | h[ 575] = 0 |

| | | | |
|---|---|---|---|
| h[ 576] = -1 | h[ 577] = 0 | h[ 578] = 0 | h[ 579] = 1 |
| h[ 580] = 0 | h[ 581] = 0 | h[ 582] = 0 | h[ 583] = 0 |
| h[ 584] = 0 | h[ 585] = 0 | h[ 586] = 0 | h[ 587] = 0 |
| h[ 588] = 1 | h[ 589] = 0 | h[ 590] = 0 | h[ 591] = 0 |
| h[ 592] = 0 | h[ 593] = -1 | h[ 594] = 0 | h[ 595] = 1 |
| h[ 596] = 0 | h[ 597] = 0 | h[ 598] = 0 | h[ 599] = 0 |
| h[ 600] = 1 | h[ 601] = 0 | h[ 602] = -1 | h[ 603] = 0 |
| h[ 604] = 0 | h[ 605] = 1 | h[ 606] = 0 | h[ 607] = 0 |
| h[ 608] = 0 | h[ 609] = -1 | h[ 610] = 0 | h[ 611] = 1 |
| h[ 612] = 0 | h[ 613] = 0 | h[ 614] = 0 | h[ 615] = 0 |
| h[ 616] = 0 | h[ 617] = 0 | h[ 618] = 0 | h[ 619] = 0 |
| h[ 620] = 0 | h[ 621] = 0 | h[ 622] = 0 | h[ 623] = 0 |
| h[ 624] = 0 | h[ 625] = 1 | h[ 626] = -1 | h[ 627] = 0 |
| h[ 628] = 0 | h[ 629] = 0 | h[ 630] = 0 | h[ 631] = -1 |
| h[ 632] = 0 | h[ 633] = 1 | h[ 634] = 0 | h[ 635] = 0 |
| h[ 636] = -1 | h[ 637] = 0 | h[ 638] = 0 | h[ 639] = 0 |
| h[ 640] = 1 | h[ 641] = 0 | h[ 642] = -1 | h[ 643] = 0 |
| h[ 644] = 0 | h[ 645] = 0 | h[ 646] = 0 | h[ 647] = 0 |
| h[ 648] = 0 | h[ 649] = 0 | h[ 650] = -1 | h[ 651] = 0 |
| h[ 652] = 0 | h[ 653] = 0 | h[ 654] = 0 | h[ 655] = 0 |
| h[ 656] = 0 | h[ 657] = 0 | h[ 658] = 0 | h[ 659] = -1 |
| h[ 660] = 0 | h[ 661] = 0 | h[ 662] = 0 | h[ 663] = 0 |
| h[ 664] = 0 | h[ 665] = 0 | h[ 666] = 1 | h[ 667] = -1 |
| h[ 668] = 0 | h[ 669] = 0 | h[ 670] = -1 | h[ 671] = 0 |
| h[ 672] = 0 | h[ 673] = 0 | h[ 674] = 0 | h[ 675] = 0 |
| h[ 676] = 0 | h[ 677] = 1 | h[ 678] = -1 | h[ 679] = 0 |
| h[ 680] = 0 | h[ 681] = 0 | h[ 682] = 0 | h[ 683] = -1 |
| h[ 684] = 0 | h[ 685] = 1 | h[ 686] = 0 | h[ 687] = 0 |
| h[ 688] = -1 | h[ 689] = 0 | h[ 690] = 0 | h[ 691] = 1 |
| h[ 692] = 0 | h[ 693] = 0 | h[ 694] = 0 | h[ 695] = 0 |
| h[ 696] = 0 | h[ 697] = 0 | h[ 698] = 0 | h[ 699] = 0 |
| h[ 700] = 0 | h[ 701] = 1 | h[ 702] = 0 | h[ 703] = -1 |
| h[ 704] = 0 | h[ 705] = 0 | h[ 706] = 0 | h[ 707] = 0 |
| h[ 708] = 1 | h[ 709] = 0 | h[ 710] = 0 | h[ 711] = 0 |
| h[ 712] = 0 | h[ 713] = 0 | h[ 714] = 1 | h[ 715] = 0 |
| h[ 716] = 0 | h[ 717] = 0 | h[ 718] = 0 | h[ 719] = 1 |
| h[ 720] = 0 | h[ 721] = 0 | h[ 722] = -1 | h[ 723] = 0 |
| h[ 724] = 1 | h[ 725] = 0 | h[ 726] = 0 | h[ 727] = 0 |
| h[ 728] = 0 | h[ 729] = 1 | h[ 730] = 0 | h[ 731] = 0 |
| h[ 732] = 0 | h[ 733] = 0 | h[ 734] = 1 | h[ 735] = 0 |
| h[ 736] = 0 | h[ 737] = 0 | h[ 738] = 0 | h[ 739] = 0 |
| h[ 740] = 0 | h[ 741] = 0 | h[ 742] = 0 | h[ 743] = 0 |
| h[ 744] = 1 | h[ 745] = 0 | h[ 746] = 0 | h[ 747] = 0 |
| h[ 748] = 0 | h[ 749] = 0 | h[ 750] = 0 | h[ 751] = 0 |
| h[ 752] = 0 | h[ 753] = 0 | h[ 754] = -1 | h[ 755] = 1 |
| h[ 756] = 0 | h[ 757] = 0 | h[ 758] = 0 | h[ 759] = 0 |
| h[ 760] = 1 | h[ 761] = 0 | h[ 762] = -1 | h[ 763] = 0 |
| h[ 764] = 0 | h[ 765] = 0 | h[ 766] = 0 | h[ 767] = -1 |
| h[ 768] = 0 | h[ 769] = 0 | h[ 770] = 1 | h[ 771] = -1 |
| h[ 772] = 0 | h[ 773] = 0 | h[ 774] = 0 | h[ 775] = 0 |
| h[ 776] = -1 | h[ 777] = 0 | h[ 778] = 0 | h[ 779] = 0 |
| h[ 780] = -1 | h[ 781] = 0 | h[ 782] = 0 | h[ 783] = 0 |
| h[ 784] = 0 | h[ 785] = 0 | h[ 786] = 0 | h[ 787] = 0 |
| h[ 788] = -1 | h[ 789] = -1 | h[ 790] = 0 | h[ 791] = 0 |
| h[ 792] = 0 | h[ 793] = -1 | h[ 794] = 0 | h[ 795] = 0 |
| h[ 796] = 0 | h[ 797] = 0 | h[ 798] = 0 | h[ 799] = -1 |
| h[ 800] = 0 | h[ 801] = 0 | h[ 802] = -1 | h[ 803] = 0 |
| h[ 804] = 0 | h[ 805] = 0 | h[ 806] = -1 | h[ 807] = 0 |
| h[ 808] = 0 | h[ 809] = 0 | h[ 810] = -1 | h[ 811] = 0 |
| h[ 812] = 0 | h[ 813] = 0 | h[ 814] = 0 | h[ 815] = 0 |
| h[ 816] = 0 | h[ 817] = 0 | h[ 818] = 0 | h[ 819] = 0 |
| h[ 820] = -1 | h[ 821] = 0 | h[ 822] = 0 | h[ 823] = -1 |
| h[ 824] = 0 | h[ 825] = 1 | h[ 826] = 0 | h[ 827] = 0 |
| h[ 828] = 0 | h[ 829] = 0 | h[ 830] = 0 | h[ 831] = 0 |
| h[ 832] = 0 | h[ 833] = 0 | h[ 834] = 0 | h[ 835] = 0 |
| h[ 836] = 0 | h[ 837] = 1 | h[ 838] = 0 | h[ 839] = 1 |
| h[ 840] = 0 | h[ 841] = 0 | h[ 842] = 0 | h[ 843] = 0 |
| h[ 844] = 0 | h[ 845] = 1 | h[ 846] = 0 | h[ 847] = 1 |
| h[ 848] = 0 | h[ 849] = 0 | h[ 850] = 1 | h[ 851] = 0 |
| h[ 852] = 0 | h[ 853] = 1 | h[ 854] = 0 | h[ 855] = 1 |

| | | | |
|---|---|---|---|
| h[ 856] = 0 | h[ 857] = 1 | h[ 858] = 1 | h[ 859] = 0 |
| h[ 860] = 1 | h[ 861] = 0 | h[ 862] = 1 | h[ 863] = 0 |
| h[ 864] = 1 | h[ 865] = 1 | h[ 866] = 0 | h[ 867] = 1 |
| h[ 868] = 0 | h[ 869] = 1 | h[ 870] = 1 | h[ 871] = 1 |
| h[ 872] = 0 | h[ 873] = 1 | h[ 874] = 1 | h[ 875] = 1 |
| h[ 876] = 0 | h[ 877] = 1 | h[ 878] = 1 | h[ 879] = 1 |
| h[ 880] = 0 | h[ 881] = 1 | h[ 882] = 0 | h[ 883] = 1 |
| h[ 884] = 1 | h[ 885] = 1 | h[ 886] = 0 | h[ 887] = 1 |
| h[ 888] = 1 | h[ 889] = 1 | h[ 890] = 1 | h[ 891] = 1 |
| h[ 892] = 1 | h[ 893] = 0 | h[ 894] = 0 | h[ 895] = 1 |
| h[ 896] = 1 | h[ 897] = 1 | h[ 898] = 0 | h[ 899] = 1 |
| h[ 900] = 0 | h[ 901] = 1 | h[ 902] = 1 | h[ 903] = 1 |
| h[ 904] = 0 | h[ 905] = 1 | h[ 906] = 1 | h[ 907] = 0 |
| h[ 908] = 1 | h[ 909] = 0 | h[ 910] = 0 | h[ 911] = 1 |
| h[ 912] = 1 | h[ 913] = 0 | h[ 914] = 1 | h[ 915] = 1 |
| h[ 916] = 0 | h[ 917] = 0 | h[ 918] = 0 | h[ 919] = 1 |
| h[ 920] = 0 | h[ 921] = 0 | h[ 922] = 1 | h[ 923] = 1 |
| h[ 924] = 0 | h[ 925] = 0 | h[ 926] = 0 | h[ 927] = 0 |
| h[ 928] = 1 | h[ 929] = 0 | h[ 930] = 0 | h[ 931] = 1 |
| h[ 932] = 0 | h[ 933] = 0 | h[ 934] = 0 | h[ 935] = 0 |
| h[ 936] = 0 | h[ 937] = 0 | h[ 938] = 0 | h[ 939] = 1 |
| h[ 940] = 0 | h[ 941] = -1 | h[ 942] = 0 | h[ 943] = 1 |
| h[ 944] = 0 | h[ 945] = 0 | h[ 946] = -1 | h[ 947] = 0 |
| h[ 948] = 0 | h[ 949] = 0 | h[ 950] = 1 | h[ 951] = 0 |
| h[ 952] = -1 | h[ 953] = 0 | h[ 954] = 0 | h[ 955] = 0 |
| h[ 956] = -1 | h[ 957] = 0 | h[ 958] = 0 | h[ 959] = 1 |
| h[ 960] = 0 | h[ 961] = -1 | h[ 962] = 0 | h[ 963] = ? |
| h[ 964] = 0 | h[ 965] = 0 | h[ 966] = 0 | h[ 967] = 0 |
| h[ 968] = 0 | h[ 969] = -1 | h[ 970] = 0 | h[ 971] = 0 |
| h[ 972] = 0 | h[ 973] = 0 | h[ 974] = 0 | h[ 975] = 0 |
| h[ 976] = -1 | h[ 977] = 0 | h[ 978] = -1 | h[ 979] = 0 |
| h[ 980] = 0 | h[ 981] = 0 | h[ 982] = 0 | h[ 983] = 0 |
| h[ 984] = 0 | h[ 985] = 0 | h[ 986] = -1 | h[ 987] = 0 |
| h[ 988] = 0 | h[ 989] = 0 | h[ 990] = 0 | h[ 991] = -1 |
| h[ 992] = 0 | h[ 993] = 1 | h[ 994] = 0 | h[ 995] = -1 |
| h[ 996] = 0 | h[ 997] = 0 | h[ 998] = 0 | h[ 999] = 0 |
| h[1000] = 0 | h[1001] = 0 | h[1002] = 0 | h[1003] = -1 |
| h[1004] = 0 | h[1005] = 0 | h[1006] = 1 | h[1007] = 0 |
| h[1008] = 0 | h[1009] = 0 | h[1010] = -1 | h[1011] = 0 |
| h[1012] = 0 | h[1013] = 1 | h[1014] = 0 | h[1015] = 0 |
| h[1016] = 0 | h[1017] = 0 | h[1018] = 0 | h[1019] = 0 |
| h[1020] = 0 | h[1021] = 0 | h[1022] = 0 | h[1023] = 0 |
| h[1024] = 1 | h[1025] = 0 | h[1026] = -1 | h[1027] = 0 |
| h[1028] = 1 | h[1029] = 0 | h[1030] = 0 | h[1031] = 0 |
| h[1032] = 0 | h[1033] = 1 | h[1034] = 0 | h[1035] = 0 |
| h[1036] = 0 | h[1037] = -1 | h[1038] = 1 | h[1039] = 0 |
| h[1040] = 0 | h[1041] = 0 | h[1042] = 1 | h[1043] = 0 |
| h[1044] = 0 | h[1045] = 0 | h[1046] = 0 | h[1047] = 0 |
| h[1048] = 0 | h[1049] = 0 | h[1050] = 1 | h[1051] = 0 |
| h[1052] = 0 | h[1053] = 0 | h[1054] = 0 | h[1055] = 0 |
| h[1056] = 0 | h[1057] = 0 | h[1058] = 0 | h[1059] = 0 |
| h[1060] = 0 | h[1061] = 0 | h[1062] = 1 | h[1063] = 0 |
| h[1064] = 0 | h[1065] = 0 | h[1066] = 0 | h[1067] = 0 |
| h[1068] = 0 | h[1069] = 1 | h[1070] = -1 | h[1071] = 0 |
| h[1072] = 0 | h[1073] = 0 | h[1074] = 0 | h[1075] = 0 |
| h[1076] = 0 | h[1077] = 0 | h[1078] = 0 | h[1079] = -1 |
| h[1080] = 0 | h[1081] = 1 | h[1082] = 0 | h[1083] = 0 |
| h[1084] = 0 | h[1085] = 0 | h[1086] = 0 | h[1087] = 0 |
| h[1088] = 0 | h[1089] = 0 | h[1090] = 0 | h[1091] = 0 |
| h[1092] = 0 | h[1093] = -1 | h[1094] = 0 | h[1095] = 0 |
| h[1096] = 0 | h[1097] = -1 | h[1098] = 0 | h[1099] = 1 |
| h[1100] = 0 | h[1101] = 0 | h[1102] = -1 | h[1103] = 0 |
| h[1104] = 1 | h[1105] = 0 | h[1106] = -1 | h[1107] = 0 |
| h[1108] = 0 | h[1109] = 0 | h[1110] = 0 | h[1111] = 0 |
| h[1112] = 0 | h[1113] = 0 | h[1114] = 0 | h[1115] = 0 |
| h[1116] = -1 | h[1117] = 0 | h[1118] = 0 | h[1119] = 0 |
| h[1120] = -1 | h[1121] = 0 | h[1122] = 1 | h[1123] = 0 |
| h[1124] = 0 | h[1125] = 0 | h[1126] = 0 | h[1127] = 0 |
| h[1128] = -1 | h[1129] = 0 | h[1130] = 0 | h[1131] = 1 |
| h[1132] = 0 | h[1133] = 0 | h[1134] = -1 | h[1135] = 0 |

```
h[1136] =   0     h[1137] =   0     h[1138] =   0     h[1139] =   0
h[1140] =   0     h[1141] =   0     h[1142] =   0     h[1143] =   0
h[1144] =   1     h[1145] =   0     h[1146] =  -1     h[1147] =   0
h[1148] =   0     h[1149] =   0     h[1150] =   0     h[1151] =   0
h[1152] =   0     h[1153] =   1     h[1154] =   0     h[1155] =   0
h[1156] =  -1     h[1157] =   0     h[1158] =   0     h[1159] =   0
h[1160] =   1     h[1161] =   0     h[1162] =   0     h[1163] =   0
h[1164] =   0     h[1165] =   0     h[1166] =   0     h[1167] =   0
h[1168] =   0     h[1169] =   0     h[1170] =   0     h[1171] =   0
h[1172] =   0     h[1173] =   1     h[1174] =   0     h[1175] =   0
h[1176] =   0     h[1177] =   0     h[1178] =   0     h[1179] =  -1
h[1180] =   0     h[1181] =   1     h[1182] =   0     h[1183] =   0
h[1184] =   0     h[1185] =   0     h[1186] =   1     h[1187] =   0
h[1188] =   0     h[1189] =  -1     h[1190] =   0     h[1191] =   0
h[1192] =   1     h[1193] =   0     h[1194] =   0     h[1195] =  -1
h[1196] =   0     h[1197] =   1     h[1198] =   0     h[1199] =   0
h[1200] =   0     h[1201] =   0     h[1202] =   0     h[1203] =   0
h[1204] =   0     h[1205] =   0     h[1206] =   0     h[1207] =   0
h[1208] =   0     h[1209] =  -1     h[1210] =   0     h[1211] =   1
h[1212] =   0     h[1213] =   1     h[1214] =   0     h[1215] =  -1
h[1216] =   0     h[1217] =   0     h[1218] =   0     h[1219] =  -1
h[1220] =   0     h[1221] =   1     h[1222] =   0     h[1223] =   0
h[1224] =   0     h[1225] =   0     h[1226] =   0     h[1227] =   0
h[1228] =   0     h[1229] =   1     h[1230] =   0     h[1231] =   0
h[1232] =   0     h[1233] =  -1     h[1234] =   0     h[1235] =   0
h[1236] =   0     h[1237] =   0     h[1238] =   0     h[1239] =   0
h[1240] =   0     h[1241] =   0     h[1242] =   0     h[1243] =   0
h[1244] =   0     h[1245] =   0     h[1246] =   0     h[1247] =   0
h[1248] =   0     h[1249] =  -1     h[1250] =   0     h[1251] =   0
h[1252] =   0     h[1253] =   1     h[1254] =   0     h[1255] =  -1
h[1256] =   0     h[1257] =   0     h[1258] =   0     h[1259] =   0
h[1260] =   1     h[1261] =   0     h[1262] =  -1     h[1263] =   0
h[1264] =   0     h[1265] =   0     h[1266] =   0     h[1267] =   0
h[1268] =  -1     h[1269] =   0     h[1270] =   1     h[1271] =   0
h[1272] =   0     h[1273] =   0     h[1274] =   0     h[1275] =   0
h[1276] =   1     h[1277] =   0     h[1278] =  -1     h[1279] =   0
h[1280] =  -1     h[1281] =   0     h[1282] =   0     h[1283] =   1
h[1284] =   0     h[1285] =   0     h[1286] =   0     h[1287] =   1
h[1288] =   0     h[1289] =  -1     h[1290] =   0     h[1291] =   0
h[1292] =   0     h[1293] =   0     h[1294] =   0     h[1295] =  -1
h[1296] =   1     h[1297] =   0     h[1298] =   0     h[1299] =   1
h[1300] =   0     h[1301] =   0     h[1302] =  -1     h[1303] =   0
h[1304] =   0     h[1305] =   1     h[1306] =   0     h[1307] =   0
h[1308] =   0     h[1309] =   0     h[1310] =   0     h[1311] =   0
h[1312] =  -1     h[1313] =   0     h[1314] =   0     h[1315] =   1
h[1316] =   0     h[1317] =   0     h[1318] =   0     h[1319] =   1
h[1320] =   0     h[1321] =  -1     h[1322] =   0     h[1323] =   0
h[1324] =   0     h[1325] =   0     h[1326] =   0     h[1327] =   0
h[1328] =   0     h[1329] =   0     h[1330] =   0     h[1331] =   0
h[1332] =   1     h[1333] =   0     h[1334] =   0     h[1335] =  -1
h[1336] =   0     h[1337] =   0     h[1338] =   1     h[1339] =   0
h[1340] =   0     h[1341] =  -1     h[1342] =   0     h[1343] =   0
h[1344] =   0     h[1345] =   0     h[1346] =   1     h[1347] =   0
h[1348] =   0     h[1349] =  -1     h[1350] =   0     h[1351] =   0
h[1352] =   0     h[1353] =   1     h[1354] =   0     h[1355] =  -1
h[1356] =   0     h[1357] =   0     h[1358] =   0     h[1359] =   1
h[1360] =   0     h[1361] =  -1     h[1362] =   0     h[1363] =   0
h[1364] =   0     h[1365] =   0     h[1366] =   0     h[1367] =   0
h[1368] =   0     h[1369] =   0     h[1370] =   0     h[1371] =   0
h[1372] =   1     h[1373] =  -1     h[1374] =   0     h[1375] =   0
h[1376] =   0     h[1377] =   0     h[1378] =  -1     h[1379] =   0
h[1380] =   0     h[1381] =   1     h[1382] =   0     h[1383] =   0
h[1384] =   0     h[1385] =  -1     h[1386] =   0     h[1387] =   1
h[1388] =   0     h[1389] =   0     h[1390] =   0     h[1391] =  -1
h[1392] =   0     h[1393] =   0     h[1394] =   0     h[1395] =   1
h[1396] =   0     h[1397] =   0     h[1398] =  -1     h[1399] =   0
h[1400] =   0     h[1401] =   0     h[1402] =   1     h[1403] =   0
h[1404] =  -1     h[1405] =   0     h[1406] =   0     h[1407] =   0
h[1408] =   0     h[1409] =   1     h[1410] =   0     h[1411] =   0
h[1412] =  -1     h[1413] =   0     h[1414] =   0     h[1415] =   0
```

| | | | |
|---|---|---|---|
| h[1416] = 0 | h[1417] = 0 | h[1418] = 0 | h[1419] = 0 |
| h[1420] = 1 | h[1421] = 0 | h[1422] = 0 | h[1423] = -1 |
| h[1424] = 0 | h[1425] = 0 | h[1426] = 1 | h[1427] = 0 |
| h[1428] = 0 | h[1429] = -1 | h[1430] = 0 | h[1431] = 0 |
| h[1432] = 0 | h[1433] = 1 | h[1434] = 0 | h[1435] = 0 |
| h[1436] = 0 | h[1437] = -1 | h[1438] = 0 | h[1439] = 0 |
| h[1440] = 1 | h[1441] = 0 | h[1442] = 0 | h[1443] = 0 |
| h[1444] = 0 | h[1445] = 0 | h[1446] = 0 | h[1447] = -1 |
| h[1448] = 0 | h[1449] = 1 | h[1450] = 0 | h[1451] = 0 |
| h[1452] = 0 | h[1453] = 0 | h[1454] = 0 | h[1455] = 0 |
| h[1456] = 0 | h[1457] = 0 | h[1458] = 0 | h[1459] = 0 |
| h[1460] = 0 | h[1461] = 0 | h[1462] = 0 | h[1463] = 0 |
| h[1464] = 0 | h[1465] = 0 | h[1466] = 0 | h[1467] = 0 |
| h[1468] = 1 | h[1469] = -1 | h[1470] = 0 | h[1471] = 0 |
| h[1472] = 0 | h[1473] = 0 | h[1474] = 0 | h[1475] = 0 |
| h[1476] = 0 | h[1477] = 0 | h[1478] = 0 | h[1479] = 0 |
| h[1480] = 1 | h[1481] = 0 | h[1482] = -1 | h[1483] = 0 |
| h[1484] = 0 | h[1485] = 0 | h[1486] = -1 | h[1487] = 1 |
| h[1488] = 0 | h[1489] = 0 | h[1490] = 0 | h[1491] = 0 |
| h[1492] = 0 | h[1493] = 0 | h[1494] = 0 | h[1495] = 0 |
| h[1496] = 1 | h[1497] = 0 | h[1498] = -1 | h[1499] = 0 |
| h[1500] = 0 | h[1501] = -1 | h[1502] = 0 | h[1503] = 1 |
| h[1504] = 0 | h[1505] = 0 | h[1506] = 0 | h[1507] = 0 |
| h[1508] = 0 | h[1509] = 0 | h[1510] = 0 | h[1511] = 0 |
| h[1512] = 0 | h[1513] = -1 | h[1514] = 0 | h[1515] = 1 |
| h[1516] = 0 | h[1517] = 0 | h[1518] = 0 | h[1519] = 0 |
| h[1520] = -1 | h[1521] = 0 | h[1522] = 1 | h[1523] = 0 |
| h[1524] = 0 | h[1525] = 0 | h[1526] = -1 | h[1527] = 0 |
| h[1528] = 1 | h[1529] = 0 | h[1530] = 0 | h[1531] = 0 |
| h[1532] = -1 | h[1533] = 0 | h[1534] = 0 | h[1535] = 1 |
| h[1536] = 0 | h[1537] = 0 | h[1538] = -1 | h[1539] = 0 |
| h[1540] = 0 | h[1541] = 1 | h[1542] = 0 | h[1543] = 0 |
| h[1544] = 0 | h[1545] = -1 | h[1546] = 0 | h[1547] = 0 |
| h[1548] = 1 | h[1549] = 0 | h[1550] = 0 | h[1551] = 0 |
| h[1552] = -1 | h[1553] = 0 | h[1554] = 0 | h[1555] = 0 |
| h[1556] = 1 | h[1557] = 0 | h[1558] = 0 | h[1559] = 0 |
| h[1560] = 0 | h[1561] = -1 | h[1562] = 0 | h[1563] = 0 |
| h[1564] = 1 | h[1565] = 0 | h[1566] = 0 | h[1567] = 0 |
| h[1568] = 0 | h[1569] = -1 | h[1570] = 0 | h[1571] = 1 |
| h[1572] = 0 | h[1573] = 0 | h[1574] = -1 | h[1575] = 0 |
| h[1576] = 1 | h[1577] = 0 | h[1578] = 0 | h[1579] = 0 |
| h[1580] = 0 | h[1581] = 0 | h[1582] = 0 | h[1583] = -1 |
| h[1584] = 0 | h[1585] = 1 | h[1586] = 0 | h[1587] = 0 |
| h[1588] = 0 | h[1589] = 0 | h[1590] = 0 | h[1591] = 0 |
| h[1592] = 0 | h[1593] = 0 | h[1594] = 0 | h[1595] = -1 |
| h[1596] = 0 | h[1597] = 1 | h[1598] = 0 | h[1599] = 0 |
| h[1600] = 0 | h[1601] = 0 | h[1602] = 1 | h[1603] = -1 |
| h[1604] = 0 | h[1605] = 0 | h[1606] = 0 | h[1607] = 0 |
| h[1608] = 0 | h[1609] = 0 | h[1610] = 0 | h[1611] = 0 |
| h[1612] = -1 | h[1613] = 0 | h[1614] = 1 | h[1615] = 0 |
| h[1616] = 0 | h[1617] = 0 | h[1618] = 0 | h[1619] = 0 |
| h[1620] = 1 | h[1621] = -1 | h[1622] = 0 | h[1623] = 0 |
| h[1624] = 0 | h[1625] = 0 | h[1626] = 0 | h[1627] = 0 |
| h[1628] = 0 | h[1629] = -1 | h[1630] = 0 | h[1631] = 1 |
| h[1632] = 0 | h[1633] = 0 | h[1634] = 0 | h[1635] = 0 |
| h[1636] = 0 | h[1637] = 0 | h[1638] = 0 | h[1639] = 0 |
| h[1640] = 0 | h[1641] = -1 | h[1642] = 0 | h[1643] = 1 |
| h[1644] = 0 | h[1645] = 0 | h[1646] = 0 | h[1647] = 0 |
| h[1648] = 0 | h[1649] = 0 | h[1650] = 0 | h[1651] = 0 |
| h[1652] = 0 | h[1653] = 0 | h[1654] = 0 | h[1655] = 0 |
| h[1656] = -1 | h[1657] = 0 | h[1658] = 0 | h[1659] = 0 |
| h[1660] = 1 | h[1661] = 0 | h[1662] = 0 | h[1663] = 0 |
| h[1664] = 0 | h[1665] = 0 | h[1666] = -1 | h[1667] = 0 |
| h[1668] = 1 | h[1669] = 0 | h[1670] = 0 | h[1671] = 0 |
| h[1672] = -1 | h[1673] = 0 | h[1674] = 1 | h[1675] = 0 |
| h[1676] = 0 | h[1677] = 0 | h[1678] = -1 | h[1679] = 0 |
| h[1680] = 1 | h[1681] = 0 | h[1682] = 0 | h[1683] = 0 |
| h[1684] = 0 | h[1685] = -1 | h[1686] = 0 | h[1687] = 0 |
| h[1688] = 1 | h[1689] = 0 | h[1690] = 0 | h[1691] = 0 |
| h[1692] = 0 | h[1693] = -1 | h[1694] = 0 | h[1695] = 0 |
| h[1696] = 1 | h[1697] = 0 | h[1698] = 0 | h[1699] = 0 |
| h[1700] = 0 | h[1701] = 0 | h[1702] = 0 | h[1703] = -1 |

| | | | |
|---|---|---|---|
| h[1704] = 0 | h[1705] = 1 | h[1706] = 0 | h[1707] = 0 |
| h[1708] = -1 | h[1709] = 0 | h[1710] = 1 | h[1711] = 0 |
| h[1712] = 0 | h[1713] = 0 | h[1714] = 0 | h[1715] = 0 |
| h[1716] = -1 | h[1717] = 0 | h[1718] = 1 | h[1719] = 0 |
| h[1720] = 0 | h[1721] = 0 | h[1722] = 0 | h[1723] = 0 |
| h[1724] = -1 | h[1725] = 0 | h[1726] = 1 | h[1727] = 0 |
| h[1728] = 0 | h[1729] = 0 | h[1730] = 0 | h[1731] = 0 |
| h[1732] = 0 | h[1733] = 0 | h[1734] = 0 | h[1735] = 0 |
| h[1736] = 0 | h[1737] = 0 | h[1738] = 0 | h[1739] = 0 |
| h[1740] = 0 | h[1741] = 0 | h[1742] = -1 | h[1743] = 0 |
| h[1744] = 1 | h[1745] = 0 | h[1746] = 0 | h[1747] = 0 |
| h[1748] = 0 | h[1749] = 0 | h[1750] = -1 | h[1751] = 1 |
| h[1752] = 0 | h[1753] = 0 | h[1754] = 0 | h[1755] = 0 |
| h[1756] = 0 | h[1757] = 0 | h[1758] = 0 | h[1759] = 0 |
| h[1760] = 1 | h[1761] = 0 | h[1762] = -1 | h[1763] = 0 |
| h[1764] = -1 | h[1765] = 0 | h[1766] = 1 | h[1767] = 0 |
| h[1768] = 0 | h[1769] = 0 | h[1770] = 0 | h[1771] = 0 |
| h[1772] = 0 | h[1773] = 0 | h[1774] = 0 | h[1775] = 0 |
| h[1776] = 0 | h[1777] = 0 | h[1778] = 0 | h[1779] = 0 |
| h[1780] = 0 | h[1781] = 0 | h[1782] = 0 | h[1783] = 0 |
| h[1784] = 0 | h[1785] = 0 | h[1786] = 0 | h[1787] = 0 |
| h[1788] = 0 | h[1789] = 0 | h[1790] = 0 | h[1791] = 0 |

What is claimed is:

1. A digital interpolator, comprising:

an input for receiving a digital input sequence at a first sampling rate;

a sample rate converter for increasing the first sampling rate to a second and higher sampling rate; and an interpolation filter for filtering out the images of the output of said rate converter input sequence, said interpolation filter having a frequency response with a pass band for passing through with minimum attenuation the interpolated input sequence, a stop band for attenuating the images of the interpolated sequence to a predetermined level, and a transition band between the pass band and the stop band, said interpolation filter including:

a Finite Impulse Response (FIR) filter having low precision FIR filter coefficients associated therewith that provide a frequency response below a point in the stop band that is commensurate with substantially higher precision FIR coefficients, and which frequency response above said point degrades in a substantially gradual manner, and a low pass filter for filtering the output of said FIR filter to attenuate signals above said point.

2. The interpolator of claim 1, wherein said point is proximate to said transition band.

3. The interpolator of claim 1, wherein said low precision FIR filter coefficients include at least the set of {−1, +1} coefficients.

4. The interpolator of claim 3, wherein said low precision FIR filter coefficients also include a zero coefficient.

5. The interpolator of claim 1, wherein said FIR filter is comprised of:

a plurality of delay blocks and a summing circuit, with the output of each of said delay blocks multiplied by associated ones of said low precision FIR filter coefficients in an associated multiplication block, and the output of each of said multiplication blocks is input to said summing circuit for summing of the results; and said FIR filter coefficients comprising the set of {−1, +1} coefficients such that only a sign change is required in said multiplication blocks.

6. The interpolator of claim 5, wherein said FIR filter coefficients also include the set of zero coefficients, such that said multiplication blocks can further output a null value in response to the associated coefficient being a zero.

7. A digital-to-analog converter comprising:

an input for receiving a digital input sequence at a first sampling rate;

a sample rate converter for increasing the first sampling rate to a second and higher sampling rate;

an interpolation filter for filtering out the images of the output of said sample rate converter, said interpolation filter having a frequency response with a pass band for passing through with minimum attenuation the converted input sequence, a stop band for attenuating the images of the converted input sequence to a predetermined level, and a transition band between the pass band and the stop band, said interpolation filter including a Finite Impulse Response (FIR) filter having low precision FIR filter coefficients associated therewith that provide a frequency response below a point in the stop band that is commensurate with substantially higher precision FIR coefficients, and which frequency response above said point in the stop band degrades in a substantially gradual manner;

a digital-analog-converter for converting the output of said interpolation filter to an analog signal; and a low pass filter for attenuating the output of said sample rate converter above said point in the stop band.

8. The digital-to-analog converter of claim 7 were in said digital-to-analog converter comprises:

a Delta-Sigma modulator for converting said digital output of said interpolation filter to an m-bit stream that represents the digital value of the input to said Delta-Sigma modulator, m being less than the length of the digital word input to said Delta-Sigma modulator;

an m-bit digital-to-analog converter; and said low pass filter comprising an analog low pass filter on the output of said m-bit digital-to-analog converter.

9. The digital-to-analog converter of claim 8 wherein m is equal to one.

10. The digital-to-analog converter of claim 8 wherein said analog low pass filter is a switched-capacitor filter.

11. The digital-to-analog converter of claim 7 wherein said point in said frequency response of said interpolation filter is proximate to said transition band.

12. The digital-to-analog converter of claim 7 wherein said low precision FIR filter coefficients include at least the set of $\{-1, +1\}$ coefficients.

13. The digital-to-analog converter of claim 12, wherein said low precision FIR filter coefficients also include a zero coefficient.

14. The digital-to-analog converter of claim 7, wherein said interpolation filter is comprised of:
   a plurality of delay blocks and a summing circuit; with the output of each of said delay blocks multiplied by associated ones of said low precision FIR filter coefficients in an associated multiplication block, and the output of each of said multiplication blocks is input to said summing circuit for summing of the results; and
   said FIR filter coefficients comprising at least the set of $\{-1, +1\}$ coefficients such that only a sign changes required in said multiplication blocks.

15. The digital-to-analog converter of claim 14, wherein said coefficients also include the set of zero coefficients, such that said multiplication blocks can further output a null value in response to the associated coefficient being a zero.

16. A method for interpolating digital data, comprising the steps of:
   receiving a digital input sequence at a first sampling rate;
   converting the input first sampling rate up to a second and higher sampling rate; and
   filtering out the images of the converted data at the second sampling rate, and the step of filtering operating with a frequency response having a pass band for passing through with minimum attenuation the converted input data at the second sampling rate, a stop band for attenuating the images of the converted data to a predetermined level, and a transition band between the pass band and the stop band, the step of filtering including the steps of:
   providing a Finite Impulse Response (FIR) filter having low precision FIR filter coefficients associated therewith that provide a frequency response below a point in the stop band that is commensurate with substantially higher precision FIR filter coefficients, and which frequency response above the point degrades in a substantially gradual manner,
   processing the converted data at the second sampling rate through the FIR filter,
   low pass filtering the output of the FIR filter to attenuate signals above the point.

17. The method of claim 16 wherein the point is proximate to the transition band within the stop band.

18. The method of claim 16 wherein the low precision FIR filter coefficients include at least the set of $\{-1, +1\}$ coefficients.

19. The method of claim 18, wherein the low precision FIR filter coefficients include a zero coefficient.

20. The method of claim 16, wherein the step of providing a FIR filter is comprised of the steps of:
   providing a plurality of delay blocks for receiving the converted data and a summing circuit;
   multiplying the output of each of the delay blocks by associated ones of the low precision FIR filter coefficients;
   outputting the multiplication results to the summing circuit and summing the results thereof; and
   the FIR filter coefficients comprising at least the set of $\{-1, +1\}$ coefficients such that only a sign change is required in the step of multiplication.

21. The method of claim 20 wherein the low precision FIR filter coefficients also include the set of zero coefficients, such that the step of multiplication can further multiply the output of the delay blocks by a null value in response to the associated FIR filter coefficient being a zero.

22. A method for converting digital signals to analog signals, comprising the steps of:
   receiving a digital input sequence at a first sampling rate;
   converting the input sequence from the first sampling rate to a second and higher sampling rate;
   filtering out the images of the converted input sequence at the second sampling rate, the step of filtering operating with a frequency response having a pass band for passing through with minimum attenuation the converted sequence, a stop band for attenuating the images of the converted sequence to a predetermined level, and a transition band between the pass band and the stop band, the step of filtering including:
   providing a Finite Impulse Response (FIR) filter having low precision FIR filter coefficients associated therewith that provide a frequency response below a point in the stop band that is commensurate with substantially higher precision FIR coefficients, and which frequency response above the point degrades in a substantially gradual manner, and
   processing the converted sequence through the FIR filter;
   processing the output of the FIR filter through a digital-to-analog converter; and
   low pass filtering the output of the digital-to-analog converter to attenuate signals above the point in the frequency response of the finite impulse response filter.

23. The method of claim 22 wherein the step of processing the data through the digital-to-analog converter comprises:
   processing the output of the FIR filter through a Delta-Sigma modulator and converting the digital output of the FIR filter at the second sampling rate to an m-bit data stream;
   providing an m-bit digital-to-analog converter and processing the output of the Delta-Sigma modulator through the m-bit digital-to-analog converter; and
   the step of low pass filtering comprising passing the output of the m-bit digital-to-analog converter through an analog low pass filter.

24. The method of claim 23 wherein the value of m is equal to one.

25. The method of claim 23 wherein the step of low pass filtering comprises low pass filtering with a switched-capacitor filter.

26. The method of claim 22 wherein the low precision FIR filter coefficients include at least the set of $\{-1, +1\}$ coefficients.

27. The method of claim 26 wherein the low precision FIR filter coefficients also include a zero coefficient.

* * * * *

UNITED STATES PATENT AND TRADEMARK OFFICE
CERTIFICATE OF CORRECTION

PATENT NO. : 5,212,659

DATED : May 18, 1993

INVENTOR(S) : Jeffrey W. Scott, Donald A. Kerth and Shochyi Lin

It is certified that error appears in the above-indentified patent and that said Letters Patent is hereby corrected as shown below:

Column 1, line 60, please delete "H[N-1]", and insert -- h[N-1] --.

Column 2, line 63, delete "interpolator", and insert -- interpolation --.

Column 3, line 41, delete ".", and insert -- ; --.

Column 4, line 14, delete "=", and insert -- be --.

Column 8, line 44, delete "n-bit", and insert -- m-bit --.

Column 9, line 10, delete "out-put", and insert -- output --.

Column 9, line 11, delete "n-bit", and insert -- m-bit --.

UNITED STATES PATENT AND TRADEMARK OFFICE
CERTIFICATE OF CORRECTION

PATENT NO. : 5,212,659
DATED : May 18, 1993
INVENTOR(S) : Jeffrey W. Scott, et al It is certified that error appears in the above-indentified patent and that said Letters Patent is hereby corrected as shown below:

Column 12, line 15, delete "1 66", and insert --166--.

Signed and Sealed this

Twenty-second Day of March, 1994

Attest:

BRUCE LEHMAN

Attesting Officer

Commissioner of Patents and Trademarks